US012232253B2

(12) United States Patent
Tada et al.

(10) Patent No.: US 12,232,253 B2
(45) Date of Patent: Feb. 18, 2025

(54) PRINTED CIRCUIT BOARD

(71) Applicant: Itabashi Seiki Co., Ltd., Tokyo (JP)

(72) Inventors: Tetsuya Tada, Tokyo (JP); Kenji Kuhara, Tokyo (JP); Takeshi Mimuro, Toyo (JP)

(73) Assignee: ITABASHI SEIKI CO., LTD., Tokyo (JP)

( * ) Notice: Subject to any disclaimer, the term of this patent is extended or adjusted under 35 U.S.C. 154(b) by 0 days.

(21) Appl. No.: 17/619,892

(22) PCT Filed: Aug. 11, 2020

(86) PCT No.: PCT/JP2020/030633
§ 371 (c)(1),
(2) Date: Dec. 16, 2021

(87) PCT Pub. No.: WO2021/029416
PCT Pub. Date: Feb. 18, 2021

(65) Prior Publication Data
US 2022/0361325 A1    Nov. 10, 2022

(30) Foreign Application Priority Data

Aug. 9, 2019    (JP) .................................. 2019-148235

(51) Int. Cl.
*H05K 1/02*    (2006.01)
*H01L 23/498*    (2006.01)

(52) U.S. Cl.
CPC ...... *H05K 1/0298* (2013.01); *H01L 23/49861* (2013.01); *H05K 1/0265* (2013.01);
(Continued)

(58) Field of Classification Search
CPC ......... H05K 1/0298; H05K 2201/0929; H05K 3/4679; H05K 2201/09709; H05K 3/4038;
(Continued)

(56) References Cited

U.S. PATENT DOCUMENTS 6,466,120 B1 * 10/2002 Tokuda ............... H01F 17/0013
336/200
7,085,118 B2 * 8/2006 Inoue ....................... H02H 9/04
361/119

(Continued)

FOREIGN PATENT DOCUMENTS

JP    H08-125339 A    5/1996
JP    2001-7468 A    1/2001
(Continued)

OTHER PUBLICATIONS

WIPO, International Search Report for International Application No. PCT/JP2020/030633, Oct. 27, 2020.

(Continued)

*Primary Examiner* — Steven T Sawyer

(57) ABSTRACT

[Object] Provided is a printed circuit board ensuring a degree of freedom in circuit design and unlikely to cause a circuit connection failure.
[Solving Means] A middle interlayer circuit 11, an upper surface side interlayer circuit 12, and a lower surface side interlayer circuit 13 are formed from a connection surface-less integral conductor. In addition, a connection surface 33 between the upper surface side interlayer circuit 12 and an upper surface side surface layer circuit 14 and a connection surface 34 between the lower surface side interlayer circuit 13 and a lower surface side surface layer circuit 15 lack a connection surface in a plate thickness direction, and thus a satisfactory connection state is achieved. Accordingly, a first circuit 10 is unlikely to cause a connection failure. In (Continued)

addition, the upper surface side interlayer circuit 12 and the lower surface side interlayer circuit 13 can be disposed at misaligned positions in the plane direction of the printed circuit board, and thus the degree of freedom in circuit design increases. Plane circuits 24 and 16 not connected to the first circuit can be disposed with insulating layers 31 and 32 sandwiched below the upper surface side interlayer circuit 12 or above the lower surface side interlayer circuit 13.

1 Claim, 14 Drawing Sheets

(52) U.S. Cl.
CPC ............... *H05K 2201/0195* (2013.01); *H05K 2201/0929* (2013.01); *H05K 2201/09709* (2013.01)

(58) Field of Classification Search
CPC .... H05K 3/4608; H05K 3/4647; H05K 1/145; H05K 1/0265; H05K 3/06; H05K 1/0263; H05K 2201/10166; H05K 2203/0323; H05K 2203/1476; H01L 23/49861; H01L 23/49827; H01L 2224/16245; H01L 2924/13091
See application file for complete search history.

(56) References Cited

U.S. PATENT DOCUMENTS

| | | | |
|---|---|---|---|
| 10,893,616 | B2 | 1/2021 | Onozeki et al. |
| 2001/0002625 | A1 | 6/2001 | Fujii et al. |
| 2002/0056192 | A1 | 5/2002 | Suwa et al. |
| 2003/0204949 | A1 | 11/2003 | Chih |
| 2004/0112633 | A1 | 6/2004 | Endo et al. |
| 2011/0132651 | A1 | 6/2011 | Lee et al. |
| 2014/0022750 | A1 | 1/2014 | Moriya et al. |
| 2016/0005526 | A1* | 1/2016 | Im ..................... H01F 17/0013 336/200 |
| 2017/0229963 | A1* | 8/2017 | Zeng .................... H05K 1/0233 |
| 2018/0233280 | A1* | 8/2018 | Ishima ................ H01F 27/2804 |

FOREIGN PATENT DOCUMENTS

| | | |
|---|---|---|
| JP | 2001-36245 A | 2/2001 |
| JP | 2004-103665 A | 4/2004 |
| JP | 2004-104045 A | 4/2004 |
| JP | 2006-332449 A | 12/2006 |
| JP | 2007-81053 A | 3/2007 |
| JP | 2009-16518 A | 1/2009 |
| JP | 2010-80866 A | 4/2010 |
| JP | 2016-92196 A | 5/2016 |
| TW | 201716367 A | 5/2017 |
| WO | 2012/133380 A1 | 10/2012 |

OTHER PUBLICATIONS

WIPO, International Preliminary Report on Patentability including Written Opinion for International Application No. PCT/JP2020/030633, Feb. 8, 2022.
EPO, Extended European Search Report for European Patent Application No. 20851464.6, Oct. 5, 2023.
Japan Patent Office, Japanese Office Action for Japanese Patent Application No. 2019-148235, Jun. 30, 2020. (A machine translation is attached hereto).
Japan Patent Office, Japanese Office Action for Japanese Patent Application No. 2019-148235, Sep. 29, 2020 (A machine translation is attached hereto).

\* cited by examiner

DRAWING OF RELATED ART

PRINTED CIRCUIT BOARD

TECHNICAL FIELD

The present invention relates to a printed circuit board ensuring a degree of freedom in circuit design and unlikely to cause a circuit connection failure.

BACKGROUND ART

As for a printed circuit board 901 illustrated in the diagram of the related art of FIG. 14, a through hole is provided in a straight line, in the plate thickness direction of a substrate, and using a drill or the like with the substrate provided with a conductor such as a copper foil on the upper and lower surfaces of a base material made of a plate-shaped insulator 902. Then, a conductor is provided in the through hole and on the copper foil on the upper and lower surfaces by plating. Subsequently, the part that becomes a circuit and the through hole are covered with an etching resist and etching is performed so that an upper surface circuit 903 and a lower surface circuit 904 are formed. The printed circuit board 901 is prepared as a result. The part where a conductor 906 is provided in the through hole is called a through hole 905. Although the upper surface circuit 903 and the lower surface circuit 904 are connected by the through hole 905, during the plating, the treatment needs to be performed in a state where the contact of the plating solution in the through hole is satisfactory. In a case where the treatment is insufficient, the problem of disconnection may arise due to deterioration over time attributable to initial disconnection or thermal expansion of the printed circuit board. From the above, it has been required to improve the reliability of the conductor 906 connecting the upper surface circuit 903 and the lower surface circuit 904 in the plate thickness direction.

In addition, in the printed circuit board 901 of the related art, the through hole needs to be provided in a straight line in the plate thickness direction, and thus the upper surface circuit 903 and the lower surface circuit 904 connected by the through hole 905 need to be provided in a straight line in the plate thickness direction of the substrate (at the same coordinates in the plane direction of the substrate). As a result, there has been a constraint in terms of the degree of freedom in circuit design.

CITATION LIST

Patent Document

Patent Document 1: JP 2006-332449 A

SUMMARY OF THE INVENTION

Problem to be Solved by the Invention

The invention has been made in view of the above, and an object of the invention is to provide a printed circuit board improving the degree of freedom in circuit design and unlikely to cause a connection failure without providing a through hole in a straight line in the plate thickness direction of the printed circuit board.

Means for Solving Problem

The invention relates to a printed circuit board including: a middle interlayer circuit (11) extending in a plane direction of the printed circuit board; an upper surface side interlayer circuit (12) provided on one end side of the middle interlayer circuit (11) and extending in a plate thickness direction; a lower surface side interlayer circuit (13) provided on the other end side of the middle interlayer circuit (11) and extending in the plate thickness direction; an upper surface side surface layer circuit (14) provided on an upper surface side of the upper surface side interlayer circuit (12); a lower surface side surface layer circuit (15) provided on a lower surface side of the lower surface side interlayer circuit (13); and insulating layers (31 and 32), in which the middle interlayer circuit (11), the upper surface side interlayer circuit (12), and the lower surface side interlayer circuit (13) are provided from a connection surface-less integral conductor, the upper surface side surface layer circuit (14) is provided over an upper surface of the insulating layer (31) and the upper surface of the upper surface side interlayer circuit (12) in a state where the upper surface of the insulating layer (31) and the upper surface of the upper surface side interlayer circuit (12) are flush with each other, and the lower surface side surface layer circuit (15) is provided over a lower surface of the insulating layer (32) and a lower surface of the lower surface side interlayer circuit (13) in a state where the lower surface of the insulating layer (32) and the lower surface of the lower surface side interlayer circuit (13) are flush with each other.

The invention relates to a printed circuit board including: a middle interlayer circuit (11) extending in a plane direction of the printed circuit board; an upper surface side interlayer circuit (12) provided on one end side of the middle interlayer circuit and extending in a plate thickness direction; a lower surface side interlayer circuit (13) provided on the other end side of the middle interlayer circuit and extending in the plate thickness direction; an insulating layer (31); an upper surface side inner'layer plane circuit (41); and an upper surface side inner layer interlayer circuit (42), in which the middle interlayer circuit (11), the upper surface side interlayer-circuit (12), and the lower surface side interlayer circuit (13) are provided from a connection surface-less integral conductor, the upper surface side inner layer plane circuit (41) is provided over an upper surface of the insulating layer (31) and an upper surface of the upper surface side interlayer circuit (12) in a state where the upper surface of the insulating layer (31) and the upper surface of the upper surface side interlayer circuit (12) are flush with each other, the upper surface side inner layer interlayer circuit (42) is provided from an integral conductor having no surface of connection to the upper surface side inner layer plane circuit (41), the upper surface side interlayer circuit (12) is connected to the other end side of the upper surface side inner layer plane circuit (41), and the upper surface side inner layer interlayer circuit (42) is provided on one end side of the upper surface side inner layer plane circuit (41).

The invention relates to a printed circuit board including: a first circuit (10) having the middle interlayer circuit (11), the upper surface side interlayer circuit (12), the lower surface side interlayer circuit (13), the upper surface side surface layer circuit (14), and the lower surface side surface layer circuit (15); and another plane circuit (16, 20) extending in a plane direction and not connected to the first circuit (10), in which insulating layers (31 and 32) are provided on an upper surface side or a lower surface side beyond the upper surface side interlayer circuit (12) or the lower surface side interlayer circuit (13), the other circuit (16, 20) is provided on an upper surface side or a lower surface side of the insulating layers (31 and 32), the insulating layers (31 and 32) are provided in a plate thickness direction of the printed circuit board between the other circuit (16, 20) and the upper surface side interlayer circuit (12) or the lower surface side interlayer circuit (13), and the other circuit (16, 20) and the upper surface side interlayer circuit (12) or the lower surface side interlayer circuit (13) are disposed so as to overlap in the plane direction of the printed circuit board.

In the invention, the other circuit (20) includes an upper surface side interlayer circuit (22) of the other circuit extending in the plate thickness direction, a middle interlayer circuit (21) of the other circuit extending in the plane direction, a lower surface side interlayer circuit (23) of the other circuit extending in the plate thickness direction, and another plane circuit (24) extending in the plane direction and the upper surface side interlayer circuit (22) of the other circuit, the middle interlayer circuit (21) of the other circuit, and the lower surface side interlayer circuit (23) of the other circuit are provided from a connection surface-less integral conductor.

Effect of the Invention

The invention relates to the printed circuit board including: the middle interlayer circuit (11) extending in the plane direction of the printed circuit board; the upper surface side interlayer circuit (12) provided on one end side of the middle interlayer circuit (11) and extending in the plate thickness direction; the lower surface side interlayer circuit (13) provided on the other end side of the middle interlayer circuit (11) and extending in the plate thickness direction; the upper surface side surface layer circuit (14) provided on the upper surface side of the upper surface side interlayer circuit (12); the lower surface side surface layer circuit (15) provided on the lower surface side of the lower surface side interlayer circuit (13); and the insulating layers (31 and 32), in which the middle interlayer circuit (11), the upper surface side interlayer circuit (12), and the lower surface side interlayer circuit (13) are provided from the connection surface-less integral conductor, the upper surface side surface layer circuit (14) is provided over the upper surface of the insulating layer (31) and the upper surface of the upper surface side interlayer circuit (12) in the state where the upper surface of the insulating layer (31) and the upper surface of the upper surface side interlayer circuit (12) are flush with each other, and the lower surface side surface layer circuit (15) is provided over the lower surface of the insulating layer (32) and the lower surface of the lower surface side interlayer circuit (13) in the state where the lower surface of the insulating layer (32) and the lower surface of the lower surface side interlayer circuit (13) are flush with each other. As a result, there is no need to dispose the connection part on the upper surface side of the upper surface side interlayer circuit and the connection part on the lower surface side of the lower surface side interlayer circuit in a straight line in the plate thickness direction as in the case of the through hole of the related art, and thus the degree of freedom in circuit design increases and a connection failure is unlikely to occur.

The invention relates to the printed circuit board including: the middle interlayer circuit (11) extending in the plane direction of the printed circuit board; the upper surface side interlayer circuit (12) provided on one end side of the middle interlayer circuit and extending in the plate thickness direction; the lower surface side interlayer circuit (13) provided on the other end side of the middle interlayer circuit and extending in the plate thickness direction; the insulating layer (31); the upper surface side inner layer plane circuit (41); and the upper surface side inner layer interlayer circuit (42), in which the middle interlayer circuit (11), the upper surface side interlayer circuit (12), and the lower surface side interlayer circuit (13) are provided from the connection surface-less integral conductor, the upper surface side inner layer plane circuit (41) is provided over the upper surface of the insulating layer (31) and the upper surface of the upper surface side interlayer circuit (12) in the state where the upper surface of the insulating layer (31) and the upper surface of the upper surface side interlayer circuit (12) are flush with each other, the upper surface side inner layer interlayer circuit (42) is provided from the integral conductor having no surface of connection to the upper surface side inner layer plane circuit (41), the upper surface side interlayer circuit (12) is connected to the other end side of the upper surface side inner layer plane circuit (41), and the upper surface side inner layer interlayer circuit (42) is provided on one end side of the upper surface side inner layer plane circuit (41). As a result, the degree of freedom in circuit design increases and a connection failure is unlikely to occur between the middle interlayer circuit (11), the upper surface side interlayer circuit (12), the lower surface side interlayer circuit (13), the upper surface side inner layer plane circuit (41), and the upper surface side inner layer interlayer circuit (42).

The invention relates to the printed circuit board including: the first circuit (10) having the middle interlayer circuit (11), the upper surface side interlayer circuit (12), the lower surface side interlayer circuit (13), the upper surface side surface layer circuit (14), and the lower surface side surface layer circuit (15); and the other plane circuit (16, 20) extending in the plane direction and not connected to the first circuit (10), in which the insulating layers (31 and 32) are provided on the upper surface side or the lower surface side beyond the upper surface side interlayer circuit (12) or the lower surface side interlayer circuit (13), the other circuit (16, 20) is provided on the upper surface side or the lower surface side of the insulating layers (31 and 32), the insulating layers (31 and 32) are provided in the plate thickness direction of the printed circuit board between the other circuit (16, 20) and the upper surface side interlayer circuit (12) or the lower surface side interlayer circuit (13), and the other circuit (16, 20) and the upper surface side interlayer circuit (12) or the lower surface side interlayer circuit (13) are disposed so as to overlap in the plane direction of the printed circuit board. As a result, the other plane circuit can be disposed on the upper surface side or the lower surface side of the upper surface side interlayer circuit (12) or the lower surface side interlayer circuit with the insulating layer sandwiched in the plate thickness direction, the degree of freedom in circuit design increases, and a first circuit connection failure is unlikely to occur.

In the invention, the other circuit (20) includes the upper surface side interlayer circuit (22) of the other circuit extending in the plate thickness direction, the middle interlayer circuit (21) of the other circuit extending in the plane direction, the lower surface side interlayer circuit (23) of the other circuit extending in the plate thickness direction, and the other plane circuit (24) extending in the plane direction and the upper surface side interlayer circuit (22) of the other circuit, the middle interlayer circuit (21) of the other circuit, and the lower surface side interlayer circuit (23) of the other circuit are provided from the connection surface-less integral conductor. As a result, the other plane circuit can be disposed on the upper surface side or the lower surface side of the upper surface side interlayer circuit (12) or the lower surface side interlayer circuit (13) with the insulating layer sandwiched in the plate thickness direction, the degree of freedom in circuit design increases, and a first circuit connection failure and a second circuit connection failure are unlikely to occur.

MODE(S) FOR CARRYING OUT THE INVENTION

Embodiments

Figure 1:
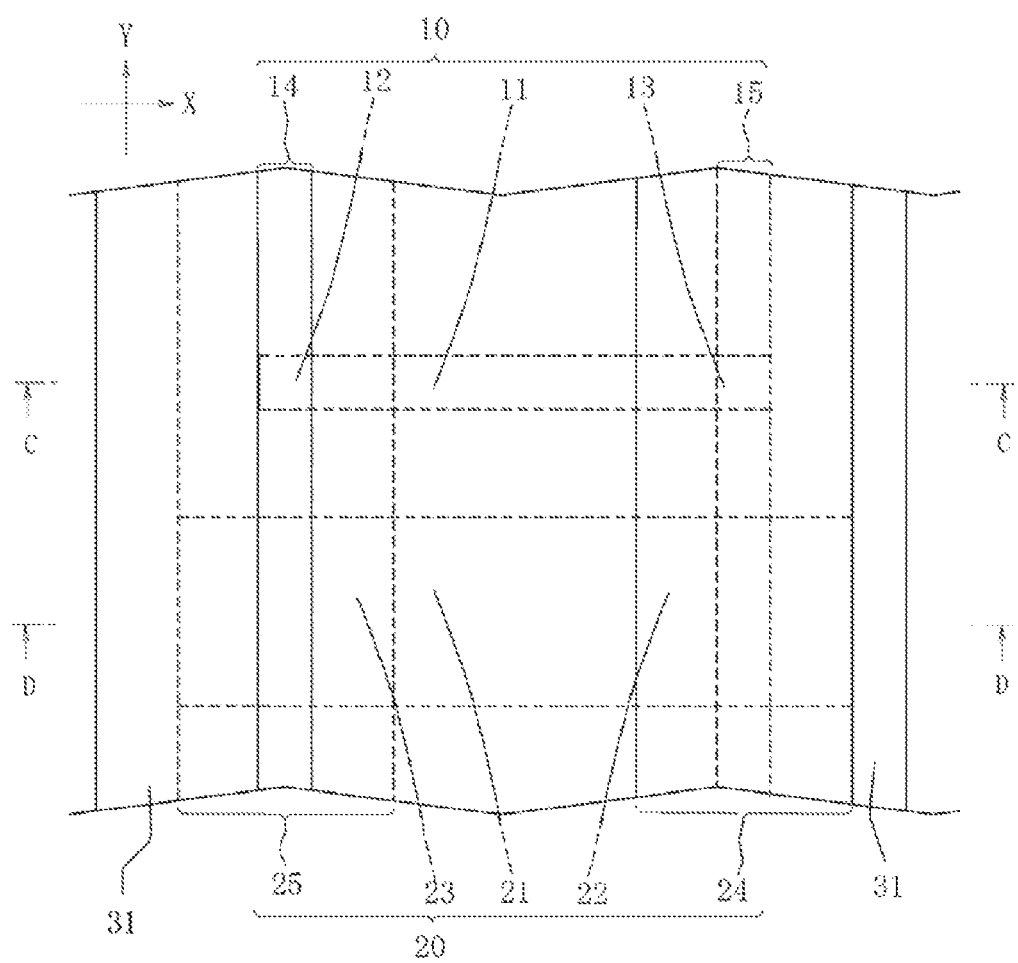
FIG. 1 is a plan view of a printed circuit board according to a first embodiment.

The structure of the printed circuit board according to a first embodiment will be described with reference to FIGS. 1 and 2. FIG. 2(1) is a C-C cross-sectional view of a printed circuit board 30 illustrated in FIG. 1, and FIG. 2(2) is a D-D cross-sectional view of the printed circuit board 30 illustrated in FIG. 1. Unlike the printed circuit board of the related art, the printed circuit board 30 lacks a through hole in the Z-axis direction (plate thickness direction) for interlayer connection. The printed circuit board 30 includes insulating layers 31 and 32, a first circuit 10, and a second circuit 20. The first circuit 10 and the second circuit 20 are not connected to each other and are separated by the insulating layers 31 and 32.

The first circuit 10 will be described with reference to FIG. 2(1). The first circuit 10 includes a middle interlayer circuit 11 of the first circuit 10, an upper surface side interlayer circuit 12 of the first circuit 10, a lower surface side interlayer circuit 13 of the first circuit 10, an upper surface side surface layer circuit 14 of the first circuit 10, and a lower surface side surface layer circuit 15 of the first circuit 10.

The middle interlayer circuit 11 of the first circuit 10 extends in the plane direction (XY-axis direction). The upper surface side interlayer circuit 12 of the first circuit 10 is provided on one end side of the middle interlayer circuit 11 of the first circuit 10. In the present embodiment, a circuit in which the middle interlayer circuit 11 of the first circuit 10 extends in a straight line in the X-axis direction is exemplified. The middle interlayer circuit 11 of the first circuit 10 and the upper surface side interlayer circuit 12 of the first circuit 10 are provided adjacent to each other, and the connection part between the middle interlayer circuit 11 of the first circuit 10 and the upper surface side interlayer. circuit 12 of the first circuit 10 lacks a connection surface in the plate thickness direction and the plane direction.

The upper surface side interlayer circuit 12 of the first circuit 10 extends in the plate thickness direction (Z-axis direction), and the upper surface side surface layer circuit 14 of the first circuit 10 is provided on the upper surface side of the upper surface. side interlayer circuit 12 of the first circuit 10. The upper surface side interlayer circuit 12 of the first circuit 10 and the upper surface side surface layer circuit 14 of the first circuit 10 are provided adjacent to each other, and a connection surface 33 is provided in the plane direction at the connection part between the upper surface side interlayer circuit 12 of the first circuit 10 and the upper surface side surface layer circuit 14 of the first circuit 10. It should be noted that the connection surface 33 is configured to be flush with the surface on the upper surface side of the insulating layer 31 and no connection surface is provided in the plate thickness direction. The upper surface side surface layer circuit 14 of the first circuit 10 extends in the plane direction. As illustrated in FIG. 2(2) and FIG. 1, the upper surface side surface layer circuit 14 of the first circuit 10 is provided so as to pass through the upper surface side beyond a lower surface side interlayer circuit 23 (described later) of the second circuit 20 and the insulating layer 31 is sandwiched in the plate thickness direction by the upper surface side surface layer circuit 14 of the first circuit 10 and the lower surface side interlayer circuit 23 of the second circuit 20.

In other words, as for the printed circuit board, the insulating layer 31 is provided between the upper surface side surface layer circuit 14 of the first circuit 10 and the lower surface side interlayer circuit 23 of the second circuit 20 in the plate thickness direction of the printed circuit board and the upper surface side surface layer circuit 14 of the first circuit 10 and the lower surface side interlayer circuit 23 of the second circuit 20 overlap in the plane direction of the printed circuit board.

In a case where a middle interlayer circuit 21 of the second circuit 20 and a lower surface side surface layer circuit 25 of the second circuit 20 are connected with a through hole of straight-line penetration provided in the plate thickness direction as in the related art, the middle interlayer circuit 21 of the second circuit 20, the lower surface side surface layer circuit 25 of the second circuit 20, and the upper surface side surface layer circuit 14 of the first circuit 10 are connected by the through hole and the first circuit 10 and the second circuit 20 become one circuit. As a result, the upper surface side surface layer circuit 14 of the first circuit 10 cannot be disposed.

On the other hand, according to the embodiment of the invention, the insulating layer 31 divides the first circuit 10 and the second circuit 20 in the plate thickness direction, and thus the middle interlayer circuit 21 of the second circuit 20 and the lower surface side surface layer circuit 25 of the second circuit 20 can be connected by the lower surface side interlayer circuit 23 of the second circuit 20 and the upper surface side surface layer circuit 14 of the first circuit 10 can be disposed.

Returning to FIG. 2(1), the lower surface side interlayer circuit 13 of the first circuit 10 is provided on the other end side of the middle interlayer circuit 11 of the first circuit 10. The middle interlayer circuit 11. of the first circuit 10 and the lower surface side interlayer circuit 13 of the first circuit 10 are provided adjacent to each other, and the connection part between the middle interlayer circuit 11 of the first circuit 10 and the lower surface side interlayer circuit 13 of the first circuit 10 lacks a connection surface in the plate thickness direction and the plane direction. The lower surface side interlayer circuit 13 of the first circuit 10 extends in the plate thickness direction (Z-axis direction), and the lower surface side surface layer circuit 15 of the first circuit 10 is provided on the lower surface side of the lower surface side interlayer circuit 13 of the first circuit 10.

The lower surface side interlayer circuit 13 of the first circuit 10 and the lower surface side surface layer circuit 15 of the first circuit 10 are provided adjacent to each other, and a connection surface 34 is provided in the plane direction at the connection part between the lower surface side interlayer circuit 13 of the first circuit 10 and the lower surface side surface layer circuit 15 of the first circuit 10. It should be noted that the connection surface 34 is configured to be flush with the surface on the lower surface side of the insulating layer 32 and no connection surface is provided in the plate thickness direction. The lower surface side surface layer circuit 15 of the first circuit 10 extends in the plane direction.

As illustrated in FIG. 2(2) and FIG. 1, the lower surface side surface layer circuit 15 of the first circuit 10 is provided so as to pass through the lower surface side beyond an upper surface side interlayer circuit 22 (described later) of the second circuit 20 and the insulating layer 32 is sandwiched in the plate thickness direction by the lower surface side surface layer circuit 15 of the first circuit 10 and the upper surface interlayer circuit 22 of the second circuit 20.

In other words, as for the printed circuit board, the insulating layer 32 is provided between the lower surface side surface layer circuit 15 of the first circuit 10 and the upper surface side interlayer circuit 22 of the second circuit 20 in the plate thickness direction of the printed circuit board and the lower surface side surface layer circuit 15 of the first circuit 10 and the upper surface side interlayer circuit 22 of the second circuit 20 overlap in the plane direction of the printed circuit board.

In a case where the middle interlayer circuit 21 of the second circuit 20 and an upper surface side surface layer circuit 24 of the second circuit 20 are connected with a through hole of straight-line penetration provided in the plate thickness direction as in the related art, the middle interlayer circuit 21 of the second circuit 20, the upper surface side surface layer circuit 24 of the second circuit 20, and the lower surface side surface layer circuit 15 of the first circuit 10 are connected by the through hole and the first circuit 10 and the second circuit 20 become one circuit. As a result, the lower surface side surface layer circuit 15 of the first circuit 10 cannot be disposed.

On the other hand, according to the embodiment of the invention, the insulating layer 32 divides the first circuit 10 and the second circuit 20 in the plate thickness direction, and thus the middle interlayer circuit 21 of the second circuit 20 and the upper surface side surface layer circuit 24 of the second circuit 20 can be connected by the upper surface side interlayer circuit 22 of the second circuit 20 and the lower surface side surface layer circuit 15 of the first circuit 10 can be disposed.

The second circuit 20 will be described with reference to FIG. 2(2). The second circuit 20 includes the middle interlayer circuit 21 of the second circuit 20, the upper surface side interlayer circuit 22 of the second circuit 20, the lower surface side interlayer circuit 23 of the second circuit 20, the upper surface side surface layer circuit 24 of the second circuit 20, and the lower surface side surface layer circuit 25 of the second circuit 20.

The middle interlayer circuit 21 of the second circuit 20 extends in the plane direction (XY-axis direction). The upper surface side interlayer circuit 22 of the second circuit 20 is provided on the other end side of the middle interlayer circuit 21 of the second circuit 20. In the present embodiment, a circuit in which the middle interlayer circuit 21 of the second circuit 20 extends in a straight line in the X-axis direction is exemplified. The middle interlayer circuit 21 of the second circuit 20 and the upper surface side interlayer circuit 22 of the second circuit 20 are provided adjacent to each other, and the connection part between the middle interlayer circuit 21 of the second circuit 20 and the upper surface side interlayer circuit 22 of the second circuit 20 lacks a connection surface in the plate thickness direction and the plane direction.

The upper surface side interlayer circuit 22 of the second circuit 20 extends in the plate thickness direction (Z-axis direction), and the upper surface side surface layer circuit 24 of the second circuit 20 is provided on the upper surface side of the upper surface side interlayer circuit 22 of the second circuit 20. The upper surface side interlayer circuit 22 of the second circuit 20 and the upper surface side surface layer circuit 24 of the second circuit 20 are provided adjacent to each other, and a connection surface 36 is provided in the plane direction at the connection part between the upper surface side interlayer circuit 22 of the second circuit 20 and the upper surface side surface layer circuit 24 of the second circuit 20. It should be noted that the connection surface 36 is configured to be flush with the surface on the upper surface side of the insulating layer 31 and no connection surface is provided in the plate thickness direction.

The upper surface side surface layer circuit 24 of the second circuit 20 extends in the plane direction. As illustrated in FIG. 2(1) and FIG. 1, the upper surface side surface layer circuit 24 of the second circuit 20 is provided so as to pass through the upper surface side beyond the lower surface side interlayer circuit 13 of the first circuit 10 and the insulating layer 31 is sandwiched in the plate thickness direction by the upper surface side surface layer circuit 24 of the second circuit 20 and the lower surface side interlayer circuit 13 of the first circuit 10.

In other words, as for the printed circuit board, the insulating layer 31 is provided between the upper surface side surface layer circuit 24 of the second circuit 20 and the lower surface side interlayer circuit 13 of the first circuit 10 in the plate thickness direction of the printed circuit board and the upper surface side surface layer circuit 24 of the second circuit 20 and the lower surface side interlayer circuit 13 of the first circuit 10 overlap in the plane direction of the printed circuit board.

In a case where the middle interlayer circuit 11 of the first circuit 10 and the lower surface side surface layer circuit 15 of the first circuit 10 are connected with a through hole of straight-line penetration provided in the plate thickness direction as in the related art, the middle interlayer circuit 11 of the first circuit 10, the lower surface side surface layer circuit 15 of the first circuit 10, and the upper surface side surface layer circuit 24 of the second circuit 20 are connected by the through hole and the first circuit 10 and the second circuit 20 become one circuit. As a result, the upper surface side surface layer circuit 24 of the second circuit 20 cannot be disposed.

On the other hand, according to the embodiment of the invention, the insulating layer 31 divides the first circuit 10 and the second circuit 20 in the plate thickness direction, and thus the middle interlayer circuit 11 of the first circuit 10 and the lower surface side surface layer circuit 15 of the first circuit 10 can be connected by the lower surface side interlayer circuit 13 of the first circuit 10 and the upper surface side surface layer circuit 24 of the second circuit 20 can be disposed.

Returning to FIG. 2(2), the lower surface side interlayer circuit 23 of the second circuit 20 is provided on one end side of the middle interlayer circuit 21 of the second circuit 20. The middle interlayer circuit 21 of the second circuit 20 and the lower surface side interlayer circuit 23 of the second circuit 20 are provided adjacent to each other, and the connection part between the middle interlayer circuit 21 of the second circuit 20 and the lower surface side interlayer circuit 23 of the second circuit 20 lacks a connection surface in the plate thickness direction and the plane direction. The lower surface side interlayer circuit 23 of the second circuit 20 extends in the plate thickness direction (Z-axis direction), and the lower surface side surface layer circuit 25 of the second circuit 20 is provided on the lower surface side of lower surface side interlayer circuit 23 of the second circuit 20.

The lower surface side interlayer circuit 23 of the second circuit 20 and the lower surface side surface layer circuit 25 of the second circuit 20 are provided adjacent to each other, and a connection surface 35 is provided in the plane direction at the connection part between the lower surface side interlayer circuit 23 of the second circuit 20 and the lower surface side surface layer circuit 25 of the second circuit 20. It should be noted that the connection surface 35 is configured to be flush with the surface on the lower surface side of the insulating layer 32 and no connection surface is provided in the plate thickness direction. The lower surface side surface layer circuit 25 of the second circuit 20 extends in the plane direction.

Figure 2:
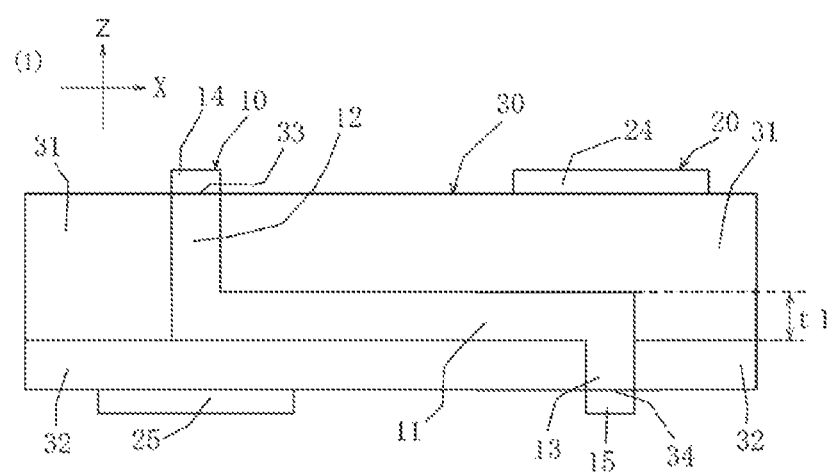
FIG. 2(1) is a cross-sectional view taken along line C-C in FIG. 1, and FIG. 2(2) is a cross-sectional view taken along line D-D in FIG. 1.
Figure 2:
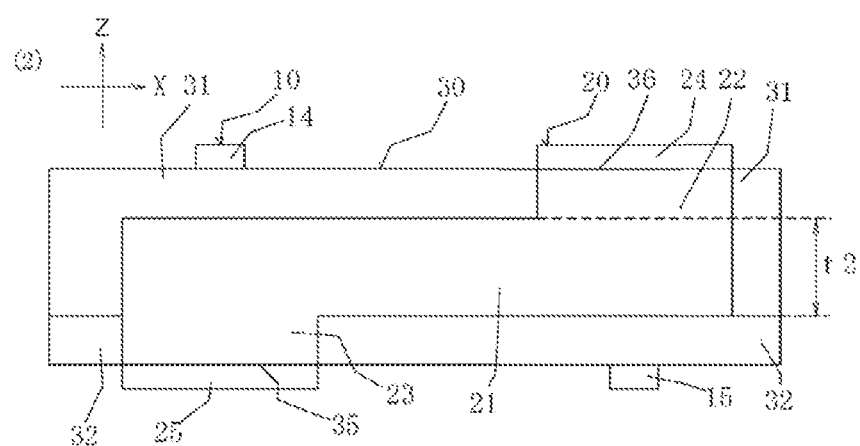

As illustrated in FIG. 2(1) and FIG. 1, the lower surface side surface layer circuit 25 of the second circuit 20 is provided so as to pass through the lower surface side beyond the upper surface side interlayer circuit 12 of the first circuit 10 and the insulating layer 32 is sandwiched in the plate thickness direction by the lower surface side surface layer circuit 25 of the second circuit 20 and the upper surface side interlayer circuit 12 of the first circuit 10.

In other words, as for the printed circuit board, the insulating layer 32 is provided between the lower surface side surface layer circuit 25 of the second circuit 20 and the upper surface side interlayer circuit 12 of the first circuit 10 in the plate thickness direction of the printed circuit board and the lower surface side surface layer circuit 25 of the second circuit 20 and the upper surface side interlayer circuit 12 of the first circuit 10 overlap in the plane direction of the printed circuit board.

In a case where the middle interlayer circuit 11 of the first circuit 10 and the upper surface side surface layer circuit 14 of the first circuit 10 are connected with a through hole of straight-line penetration provided in the plate thickness direction as in the related art, the middle interlayer circuit 11 of the first circuit 10, the upper surface side surface layer circuit 14 of the first circuit 10, and the lower surface side surface layer circuit 25 of the second circuit 20 are connected by the through hole and the first circuit 10 and the second circuit 20 become one circuit. As a result, the lower surface side surface layer circuit 25 of the second circuit 20 cannot be disposed.

On the other hand, according to the embodiment of the invention, the insulating layer 32 divides the first circuit 10 and the second circuit 20 in the plate thickness direction, and thus the middle interlayer circuit 11 of the first circuit 10 and the upper surface side surface layer circuit 14 of the first circuit 10 can be connected by the upper surface side interlayer circuit 12 of the first circuit 10 and the lower surface side surface layer circuit 25 of the second circuit 20 can be disposed.

The middle interlayer circuit 11 of the first circuit 10, the upper surface side interlayer circuit 12 of the first circuit 10, and the lower surface side interlayer circuit 13 of the first circuit 10 are configured by a connection surface-less integral conductor, and thus the connection surface does not peel off due to thermal expansion of the conductor. In addition, there is no electrical resistance attributable to the presence of a connection surface, and thus the invention is suitable as a circuit allowing a large current to flow.

The conductors of the upper surface side surface layer circuit 14 of the first circuit 10 and the lower surface side surface layer circuit 15 of the first circuit 10 are configured by plating, and the plating is performed with the upper surface of the upper surface side interlayer circuit 12 of the first circuit 10 and the upper surface of the insulating layer 31 flush with each other and the lower surface of the lower surface side interlayer circuit 13 of the first circuit 10 and the lower surface of the insulating layer 32 flush with each other. As a result, the contact of the upper surface of the upper surface side interlayer circuit 12 of the first circuit 10, the upper surface of the insulating layer 31, the lower surface of the lower surface side interlayer circuit 13 of the first circuit 10, and the lower surface of the insulating layer 32 with the plating solution is satisfactory. A conductor is provided over the upper surface of the upper surface side interlayer circuit 12 of the first circuit 10 and the upper surface of the insulating layer 31, and a conductor is provided over the lower surface of the lower surface side interlayer circuit 13 of the first circuit 10 and the lower surface of the insulating layer 32. As a result, the connection surface is unlikely to peel off due to thermal expansion of the conductor even with the connection surfaces 33 and 34 present.

The middle interlayer circuit 21 of the second circuit 20, the upper surface side interlayer circuit 22 of the second circuit 20, and the lower surface side interlayer circuit 23 of the second circuit 20 are configured by a connection surface-less integral conductor, and thus the connection surface does not peel off due to thermal expansion of the conductor. In addition, there is no electrical resistance attributable to the presence of a connection surface, and thus the invention is suitable as a circuit allowing a large current to flow.

The conductors of the upper surface side surface layer circuit 24 of the second circuit 20 and the lower surface side surface layer circuit 25 of the second circuit 20 are configured by plating, and the plating is performed with the upper surface of the upper surface side interlayer circuit 22 of the second circuit 20 and the upper surface of the insulating layer 31 flush with each other and the lower surface of the lower surface side interlayer circuit. 23 of the second circuit 20 and the lower surface of the insulating layer 32 flush with each other. As a result, the contact of the upper surface of the upper surface side interlayer circuit 22 of the second circuit 20, the upper surface of the insulating layer 31, the lower surface of the lower surface side interlayer circuit 23 of the second circuit 20, and the lower surface of the insulating layer 32 with the plating solution is satisfactory. A conductor is provided over the upper surface of the upper surface side interlayer circuit 22 of the second circuit 20 and the upper surface of the insulating layer 31, and a conductor is provided over the lower surface of the lower surface side interlayer circuit 23 of the second circuit 20 and the lower surface of the insulating layer 32. As a result, the connection surface is unlikely to peel off due to thermal expansion of the conductor even with the connection surfaces 35 and 36 present.

The first circuit 10 has the upper surface side interlayer circuit 12 of the first circuit 10 provided on one end side of the middle interlayer circuit 11 of the first circuit 10 and the lower surface side interlayer circuit 13 of the first circuit 10 provided on the other end side of the middle interlayer circuit 11 of the first circuit 10. As a result, there is no need to dispose the connection part on the upper surface side of the upper surface side interlayer circuit 12 of the first circuit 10 and the connection part on the lower surface side of the lower surface side interlayer circuit 13 of the first circuit 10 in a straight line in the plate thickness direction as in the case of the through hole of the related art, and thus the degree of freedom in circuit design increases.

The second circuit 20 has the upper surface side interlayer circuit 22 of the second circuit 20 provided on one end side of the middle interlayer circuit 21 of the second circuit 20 and the lower surface side interlayer circuit 23 of the second circuit 20 provided on the other end side of the middle interlayer circuit 21 of the second circuit 20. As a result, there is no need to dispose the connection part on the upper surface side of the upper surface side interlayer circuit 22 of the second circuit 20 and the connection part on the lower surface side of the lower surface side interlayer circuit 23 of the second circuit 20 in a straight line in the plate thickness direction as in the case of the through hole of the related art, and thus the degree of freedom in circuit design increases.

Figure 3:
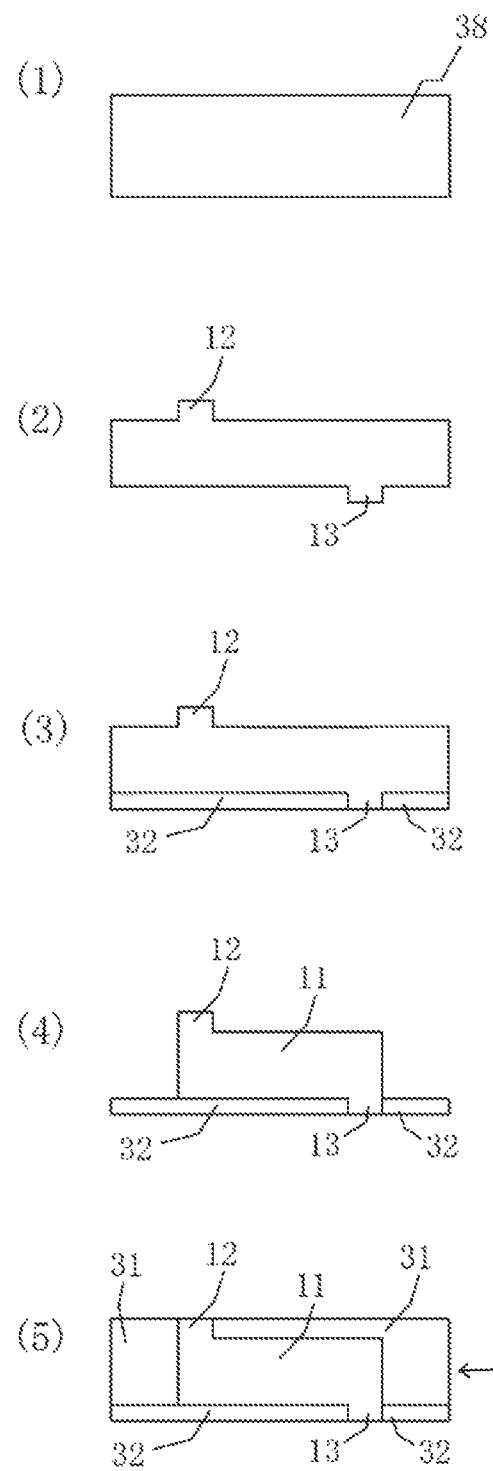
FIG. 3 is a process diagram of a method for manufacturing the printed circuit board according to the first embodiment in the C-C cross-sectional view illustrated in FIG. 2.

A method for manufacturing the printed circuit board 30 will be described with reference to FIGS. 3 and 4. A plate-shaped conductor 38 having a flat surface is prepared as illustrated in FIG. 3(1) and FIG. 4(1). Although copper or aluminum can be used as the conductor, the invention is not limited thereto. Any substance conducting electricity as an electric circuit of a printed circuit board can be used as the conductor.

A rolled plate can be used as the conductor 38. The rolled plate is manufactured by inserting a conductor ingot as a raw material between two rotating rolls, stretching the ingot while crushing it, and reducing its thickness to a target thickness.

Specifically, a rolled copper plate or a rolled aluminum plate can be used.

The thickness of the plate-shaped conductor 38 having a flat surface is not particularly limited. However, the lower limit value of the thickness in a case where a rolled copper plate or rolled aluminum plate is used for the conductor 38 is preferably 0.3 mm or more and more preferably 0.6 mm or more. In addition, the upper limit value of the thickness in a case where a rolled copper plate or rolled aluminum plate is used for the conductor 38 is preferably 2.0 mm or less and more preferably 1.0 mm or less. Within this range, the conductor 38 can be easily handled in the manufacturing process.

In a case where the thickness of the conductor 38 exceeds 1.0 mm, it is difficult to control the width of the circuit (middle interlayer circuits 11 and 21, upper surface side interlayer circuits 12 and 22, lower surface side interlayer circuits 13 and 23) by etching and the manufacturing cost is high. It should be noted that the plate-shaped conductor 38 also includes a conductor mass.

Half-etching is performed with the plate-shaped conductor 38 provided with a resist that protects the part of the first circuit 10 that becomes the upper surface side interlayer circuit 12, the part of the first circuit 10 that becomes the lower surface side interlayer circuit 13, the part of the second circuit 20 that becomes the upper surface side interlayer circuit 22, and the part of the second circuit 20 that becomes the lower surface side interlayer circuit 23.

Figure 4:
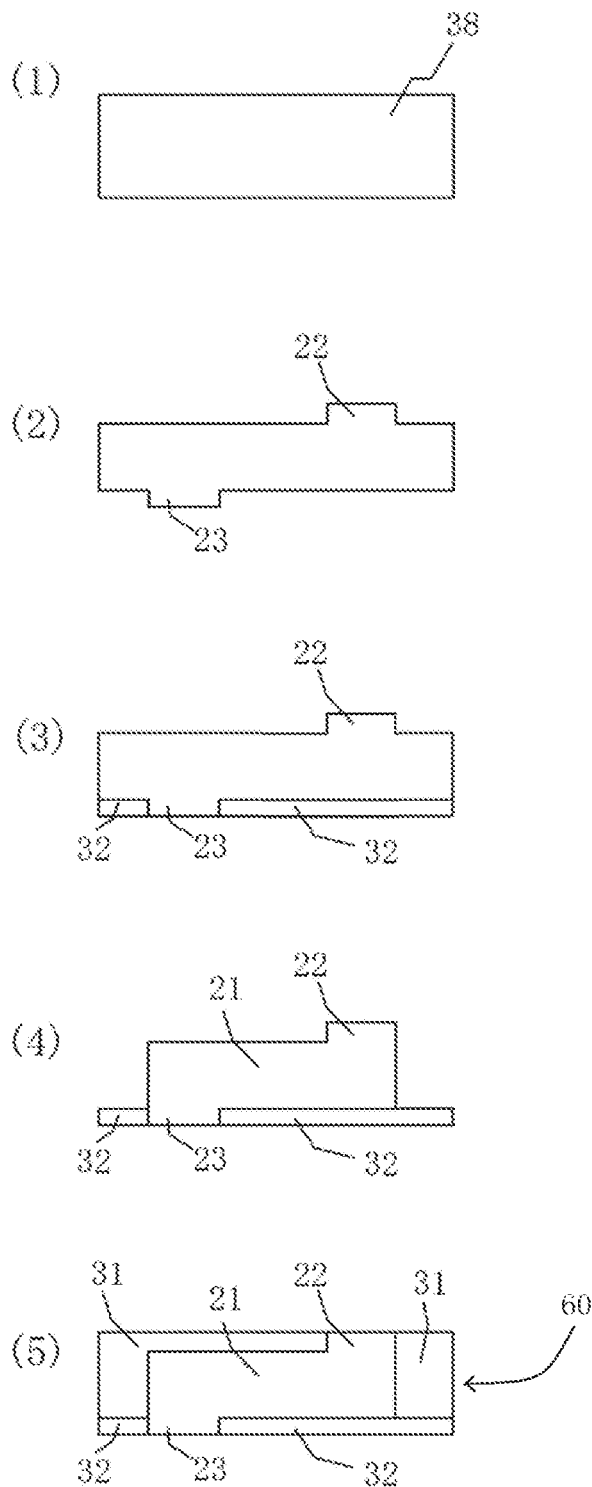
FIG. 4 is a process diagram of the method for manufacturing the printed circuit board according to the first embodiment in the D-D cross-sectional view illustrated in FIG. 2.

As illustrated in FIG. 3(2) and FIG. 4(2), the half-etching is performed such that the middle part of the plate-shaped conductor 38 in the plate thickness direction is left and the upper surface side interlayer circuit 12 of the first circuit 10, the lower surface side interlayer circuit 13 of the first circuit 10, the upper surface side interlayer circuit 22 of the second circuit 20, and the lower surface side interlayer circuit 23 of the second circuit 20 are provided. Then, the resist is removed and, as illustrated in FIG. 3(3) and FIG. 4(3), the lower surface of the conductor 38 is filled with an insulating resin and the insulating layer 32 is provided.

Subsequently, etching is performed with a resist provided that protects the upper surface side interlayer circuit 12 of the first circuit 10, the part of the first circuit 10 that becomes the middle interlayer circuit 11, the upper surface side interlayer circuit 22 of the second circuit 20, the part of the second circuit 20 that becomes the middle interlayer circuit 21, and the entire lower surface of the conductor 38. Then, the resist is removed. As illustrated in FIG. 3(4) and FIG. 4(4), the etching is performed such that the insulating layer 32 is exposed from the upper surface of the conductor 38.

As illustrated in FIGS. 3(5) and 4(5), the upper surface of the conductor 38 is filled with an insulating resin and the insulating layer 31 is provided. Then, surface polishing and cleaning are performed on the upper surface of the upper surface side interlayer circuit 12 of the first circuit 10, the upper surface of the upper surface side interlayer circuit 22 of the second circuit 20, the upper surface of the insulating layer 31, the lower surface of the lower surface side interlayer circuit 13 of the first circuit 10, the lower surface of the lower surface side interlayer circuit 23 of the second circuit 20, and the lower surface of the insulating layer 32. Then, the upper surface of the upper surface side interlayer circuit 12 of the first circuit. 10, the upper: surface of the upper surface side interlayer circuit 22 of the second circuit 20, and the upper surface of the insulating layer 31 become flush and the lower surface of the lower surface side interlayer circuit 13 of the first circuit 10, the lower surface of the lower surface side interlayer circuit 23 of the second circuit 20, and the lower surface of the insulating layer 32 become flush. It should be noted that the state where the surface polishing and cleaning are performed is referred to as a substrate intermediate body 60. It should be noted that the substrate intermediate body 60 may have at least the middle interlayer circuit 11 of the first circuit 10, the upper surface side interlayer circuit 12 of the first circuit 10, and the lower surface side interlayer circuit 13 of the first circuit 10 and even a case where the middle interlayer circuit 21 of the second circuit 20, the upper surface side interlayer circuit 22 of the second circuit 20, and the lower surface side interlayer circuit 23 of the second circuit 20 are not provided corresponds to the substrate intermediate body 60.

Subsequently, plating is performed and a conductor resulting from the plating is provided over the upper surface side interlayer circuit 12 of the first circuit 10, the upper surface of the upper surface side interlayer circuit 22 of the second circuit 20, and the upper surface of the insulating layer 31. In addition, a conductor resulting from the plating is provided over the lower surface side interlayer circuit 13 of the first circuit 10, the lower surface of the lower surface side interlayer circuit 23 of the second circuit 20, and the lower surface of the insulating layer 32. Copper plating can be used for the formation of the conductor resulting from the plating.

Subsequently, a resist is provided on the conductor provided as a result of the plating and etching is performed. As a result, the upper surface side surface layer circuit 14 of the first circuit 10, the upper surface side surface layer circuit 24 of the second circuit 20, the lower surface side surface layer circuit 15 of the first circuit 10, and the lower surface side surface layer circuit 25 of the second circuit 20 are provided. The first circuit 10 and the second circuit 20 are completed and the printed circuit board 30 is completed as a result. Subsequently, a solder resist is applied to the printed circuit board 30 and the printed circuit board 30 of the embodiment of the invention is completed.

The middle interlayer circuit 11 of the first circuit 10, the upper surface side interlayer circuit 12 of the first circuit 10, and the lower surface side interlayer circuit 13 of the first circuit 10 being a connection surface-less integral conductor is that the middle interlayer circuit 11 of the first circuit 10, the upper surface side interlayer circuit 12 of the first circuit 10, and the lower surface side interlayer circuit 13 of the first circuit 10 are formed by modeling one conductor. The modeling may be any processing for changing the shape of the integral conductor, and examples thereof include etching, cutting, polishing, laser processing, and pressing working. As a result, the middle interlayer circuit 11 of the first circuit 10, the upper surface side interlayer circuit 12 of the first circuit 10, and the lower surface side interlayer circuit 13 of the first circuit 10 become a connection surface-less integral conductor. Since there is no connection part, a connection failure is unlikely to occur and electrical resistance attributable to the presence of a connection part can be suppressed.

The middle interlayer circuit 21 of the second circuit 20, the upper surface side interlayer circuit 22 of the second circuit 20, and the lower surface side interlayer circuit 23 of the second circuit 20 being a connection surface-less integral conductor is that the middle interlayer circuit 21 of the second circuit 20, the upper surface side interlayer circuit 22 of the second circuit 20, and the lower surface side interlayer circuit 23 of the second circuit 20 are formed by modeling one conductor. The modeling may be any processing for changing the shape of the integral conductor, and examples thereof include etching, cutting, polishing, laser processing, and pressing working. As a result, the middle interlayer circuit 21 of the second circuit 20, the upper surface side interlayer circuit 22 of the second circuit 20, and the lower surface side interlayer circuit 23 of the second circuit 20 become a connection surface-less integral conductor. Since there is no connection part, a connection failure is unlikely to occur and electrical resistance attributable to the presence of a connection part can be suppressed.

In a case where the first circuit 10 or the second circuit 20 is used as a signal line that requires impedance control, the impedance control can be performed by a thickness t1 of the middle interlayer circuit 11 of the first circuit 10 in the plate thickness direction being different from a thickness t2 of the middle interlayer circuit 21 of the second circuit 20 in the plate thickness direction. In addition, the cross-sectional area of the upper surface side interlayer circuit 12 of the first circuit 10 or the upper surface side interlayer circuit 22 of the second circuit 20 in the plane direction and the cross-sectional area of the lower surface side interlayer circuit 13 of the first circuit 10 or the lower surface side interlayer circuit 23 of the second circuit 20 in the plane direction can be designed to differ from each other, and thus the degree of freedom in circuit design increases.

Describing a case where impedance control is performed on the first circuit 10 as an example, the middle interlayer circuit 11 of the first circuit 10 smaller in thickness in the plate thickness direction than the middle interlayer circuit 21 of the second circuit 20 may be provided by a resist that protects the upper surface side interlayer circuit 12 of the first circuit 10, the upper surface side interlayer circuit 22 of the second circuit 20, the middle interlayer circuit 21 of the second circuit 20, and the entire lower surface of the conductor 38 being provided and half-etching being performed after the step of the state illustrated in FIG. 3(4) and FIG. 4(4) and before the step of the state illustrated in FIGS. 3(5) and 4(5). As a result of such a manufacturing process, the thickness t1 of the middle interlayer circuit 11 of the first circuit 10 in the plate thickness direction can be adjusted to be smaller than the thickness t2 of the middle interlayer circuit 21 of the second circuit 20 in the plate thickness direction, and thus the degree of freedom in circuit design is improved.

Figure 5:
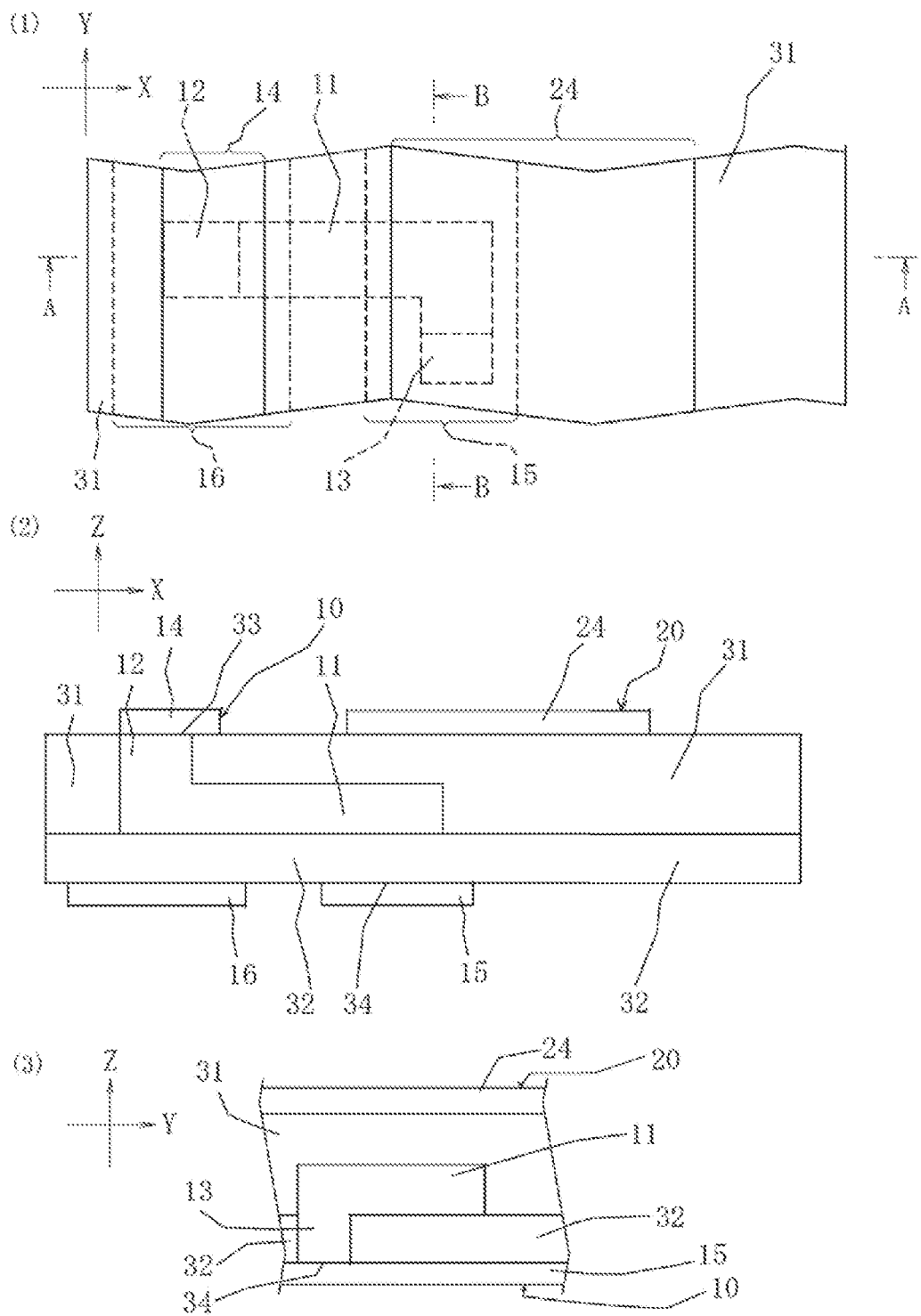
FIG. 5(1) is a plan view of a printed circuit board according to a second embodiment, FIG. 5(2) is a cross-sectional view taken along line A-A in FIG. 5(1), and FIG. 5(3) is a cross-sectional view taken along line B-B in FIG. 5(1)

The structure of the printed circuit board according to a second embodiment will be described with reference to FIG. 5. The first circuit 10 of the second embodiment has the same configuration as the first circuit 10 of the first embodiment. The second circuit 20 of the second embodiment is different from the second circuit 20 of the first embodiment in that only the upper surface side surface layer circuit 24 is provided and the middle interlayer circuit 21 of the second circuit 20, the upper surface side interlayer circuit 22 of the second circuit 20, the lower surface side interlayer circuit 23 of the second circuit 20, and the lower surface side surface layer circuit 25 of the second circuit 20 are not provided. In other words, the second circuit 20 does not need to have the middle interlayer circuit 21 of the second circuit 20, the upper surface side interlayer circuit 22 of the second circuit 20, and the lower surface side interlayer circuit 23 of the second circuit 20. In addition, a lower surface side surface layer circuit 16 of a third circuit extending in the plane direction without being connected to the first circuit 10 and the second circuit 20 is provided. It should be noted that the present embodiment exemplifies a case where the middle interlayer circuit 11 of the first circuit 10 extends in the X-axis and Y-axis directions.

The upper surface side surface layer circuit 24 of the second circuit 20 is provided so as to pass through the upper surface side beyond the lower surface side interlayer circuit 13 of the first circuit 10, and the upper surface side surface layer circuit 24 of the second circuit 20 and the lower surface side interlayer circuit 13 of the first circuit 10 sandwich the insulating layer 31 in the plate thickness direction and overlap in the plane direction of the printed circuit board.

In other words, as for the printed circuit board, the insulating layer 31 is provided between the upper surface side surface layer circuit 24 of the second circuit 20 and the lower surface side surface layer circuit 15 of the first circuit 10 in the plate thickness direction of the printed circuit board and the upper surface side surface layer circuit 24 of the second circuit 20 and the lower surface side surface layer circuit 15 of the first circuit 10 overlap in the plane direction of the printed circuit board. As the effect of this configuration, the insulating layer 31 divides the first circuit 10 and the second circuit 20 in the plate thickness direction, and thus the middle interlayer circuit 11 of the first circuit 10 and the lower surface side surface layer circuit 15 of the first circuit 10 can be connected by the lower surface, side interlayer circuit 13 of the first circuit 10 and the upper surface side surface layer circuit 24 of the second circuit 20 can be disposed.

The lower surface side surface layer circuit 16 of the third circuit is provided so as to pass through the lower surface side beyond the upper surface side interlayer circuit 12 of the first circuit 10, and the lower surface side surface layer circuit 16 of the third circuit and the upper surface side interlayer circuit 12 of the first circuit 10 sandwich the insulating layer 32 in the plate thickness direction and overlap in the plane direction of the printed circuit board.

In other words, as for the printed circuit board, the insulating layer 32 is provided between the lower surface side surface layer circuit 16 of the third circuit and the upper surface side surface layer circuit 14 of the first circuit 10 in the plate thickness direction of the printed circuit board and the lower surface side surface layer circuit 16 of the third circuit and the upper surface side surface layer circuit 14 of the first circuit 10 overlap in the plane direction of the printed circuit board.

As the effect of the present embodiment exemplifies a case, in a case where the middle interlayer circuit 11 of the first circuit 10 and the upper surface side surface layer circuit 14 of the first circuit 10 are connected with a through hole of straight-line penetration provided in the plate thickness direction as in the related art, the middle interlayer circuit 11 of the first circuit 10, the upper surface side surface layer circuit 14 of the first circuit 10, and the lower surface side surface layer circuit 16 of the third circuit are connected by the through hole and the first circuit 10 and the third-circuit become one circuit. As a result, the lower surface side surface layer circuit 16 of the third circuit cannot be disposed.

On the other hand, according to the embodiment of the invention, the insulating layer 32 divides the first circuit 10 and the third-circuit in the plate thickness direction, and thus the middle interlayer circuit 11 of the first circuit 10 and the upper surface side surface layer circuit 14 of the first circuit 10 can be connected by the upper surface side interlayer circuit 12 of the first circuit 10 and the lower surface side surface layer circuit 16 of the third circuit can be disposed.

Regarding a method for manufacturing the printed circuit board according to the second embodiment, the upper surface side surface layer circuit 24 of the second circuit 20 and the lower surface side surface layer circuit 16 of the third circuit may be provided by preparing the substrate intermediate body 60 without performing the step of the second circuit 20 illustrated in FIG. 4, providing a resist on the conductor provided as a result of the plating, and performing etching in the manufacturing method of the printed circuit board according to a first embodiment (reference to FIGS. 3 and 4).

The structure of the printed circuit board according to a third embodiment will be described with reference to FIGS. 6 and 7. In the third embodiment, an upper surface side inner layer circuit 40 of the first circuit 10 is provided between the upper surface side interlayer circuit 12 and the upper surface side surface layer circuit 14 of the first circuit 10 of the second embodiment.

The upper surface side inner layer circuit 40 of the first circuit 10 includes an upper surface side inner layer plane circuit 41 of the first circuit 10 and an upper surface side inner layer interlayer circuit 42 of the first circuit 10. The first circuit 10 according to the third embodiment is a structure including the middle interlayer circuit 11 of the first circuit 10, the upper surface side interlayer circuit 12 of the first circuit 10, the lower surface side interlayer circuit 13 of the first circuit 10, the upper surface side surface layer circuit 14 of the first circuit 10, the lower surface side surface layer circuit 15 of the first circuit 10, the upper surface side inner layer plane circuit 41 of the first circuit 10, and the upper surface side inner layer interlayer circuit 42 of the first circuit 10.

Figure 6:
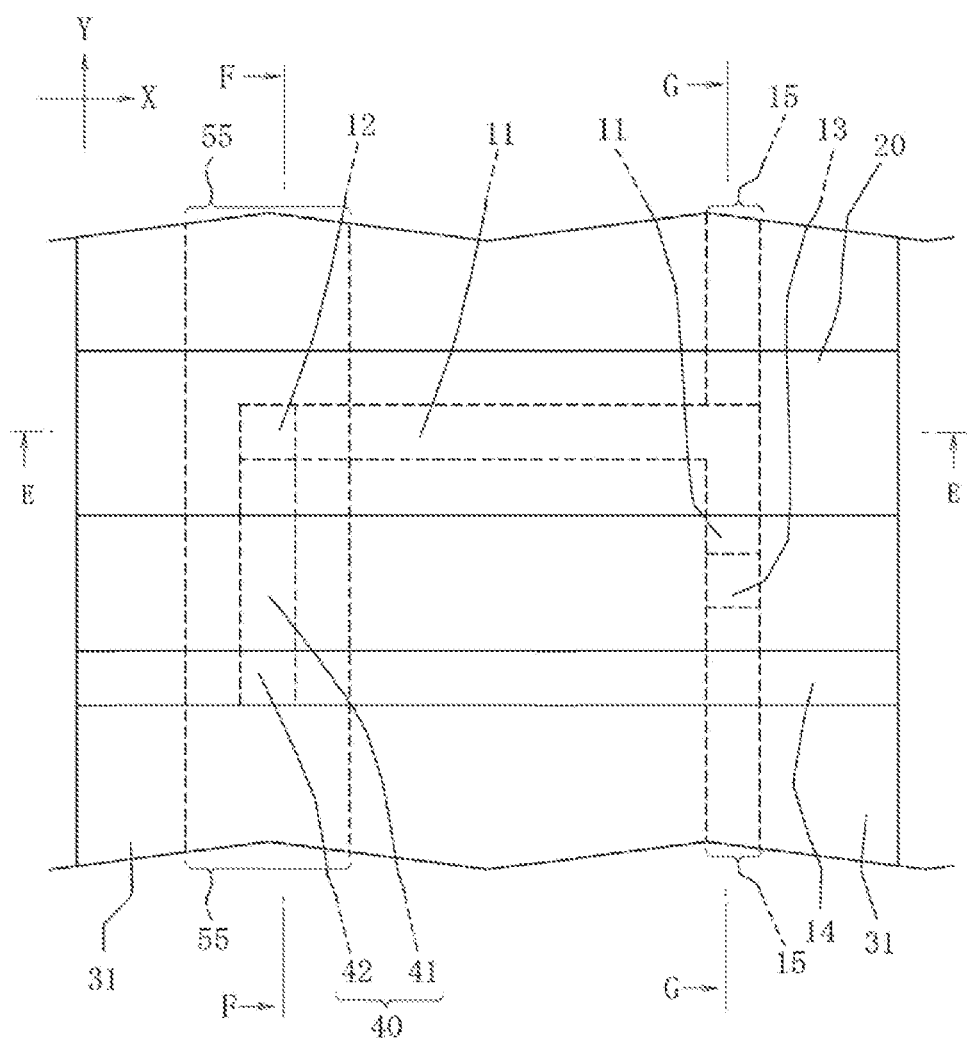
FIG. 6 is a plan view of a printed circuit board according to a third embodiment.
Figure 7:
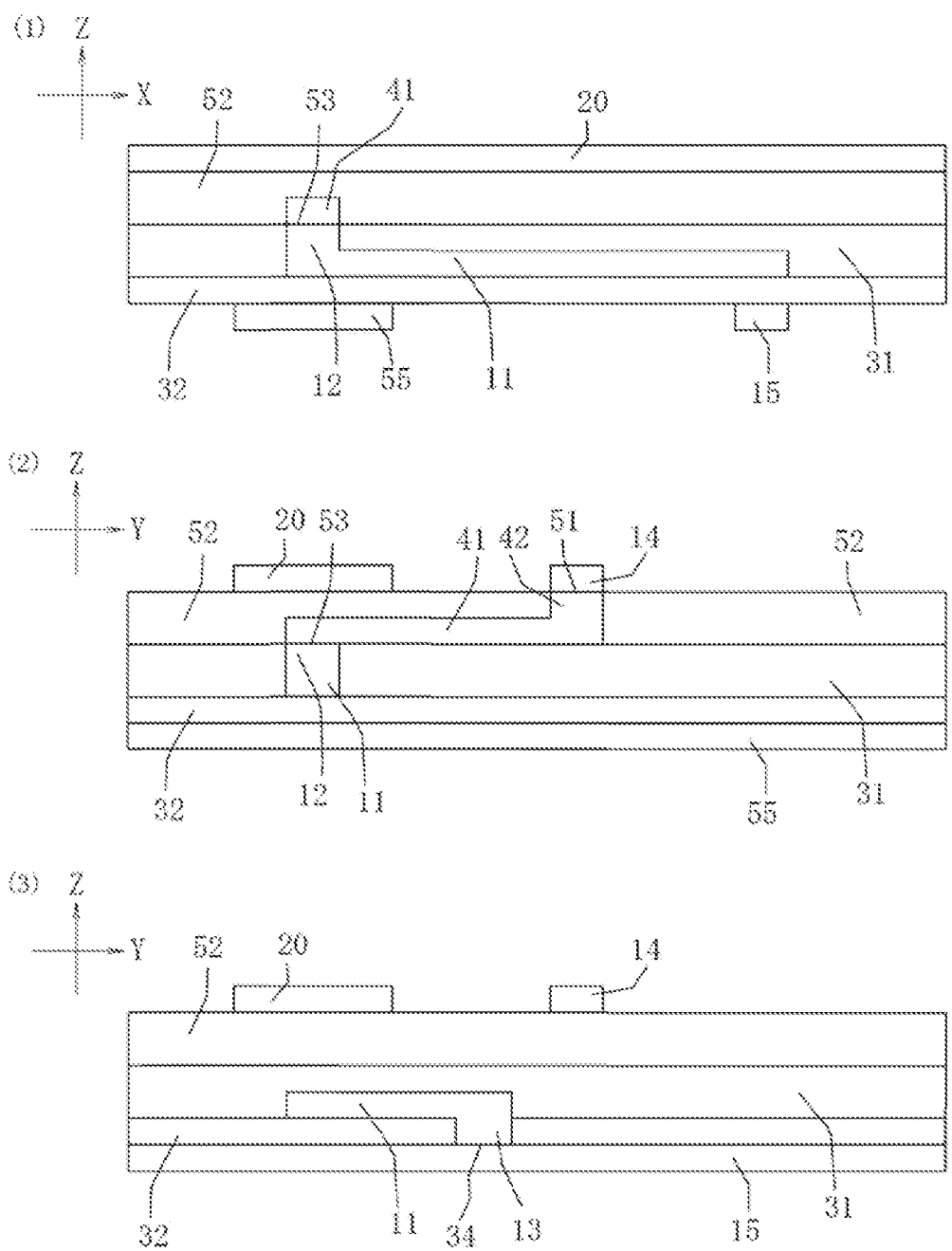
FIG. 7(1) is a cross-sectional view taken along line E-E in FIG. 6, FIG. 7(2) is a cross-sectional view taken along line F-F in FIG. 6, and FIG. 7(3) is a cross-sectional view taken along line G-G in FIG. 6.

As illustrated in the F-F cross-sectional view of FIG. 6 illustrated in FIG. 7(2), the upper surface side inner layer plane circuit 41 of the first circuit 10 extends in the plane direction of the printed circuit board and the upper surface side inner layer interlayer circuit 42 of the first circuit 10 is provided on one end side of the upper surface side inner layer plane circuit 41 of the first circuit 10. The upper surface side inner layer plane circuit 41 of the first circuit 10 and the upper surface side inner layer interlayer circuit 42 of the first circuit 10 are provided adjacent to each other and configured from an integral conductor in which the connection part between the upper surface side inner layer plane circuit 41 of the first circuit 10 and the upper surface side inner layer interlayer circuit 42 of the first circuit 10 lacks a connection surface in the plate thickness direction and the plane direction.

The upper surface side inner layer interlayer circuit 42 of the first circuit 10 extends in the plate thickness direction (Z-axis direction), and the upper surface side surface layer circuit 14 of the first circuit 10 extending in the plane direction is provided on the upper surface side of the upper surface side inner layer interlayer circuit 42 of the first circuit 10. The upper surface side inner layer interlayer circuit 42 of the first circuit 10 and the upper surface side surface layer circuit 14 of the first circuit 10 are provided adjacent to each other, and a connection surface 51 is provided in the plane direction at the connection part between the upper surface side inner layer interlayer circuit 42 of the first circuit 10 and the upper surface side surface layer circuit 14 of the first circuit 10. It should be noted that the connection surface 51 is configured to be flush with the surface on the upper surface side of an insulating layer 52 and no connection surface is provided in the plate thickness direction.

In addition, the other end side of the upper surface side inner layer plane circuit 41 of the first circuit 10 is adjacent to the upper surface side interlayer circuit 12 of the first circuit 10 and a connection surface 53 is provided in the plane direction at the connection part between the upper surface side inner layer plane circuit 41 of the first circuit 10 and the upper surface side interlayer circuit 12 of the first circuit 10. It should be noted that the connection surface 53 is configured to be flush with the surface on the upper surface side of the insulating layer 31 and no connection surface is provided in the plate thickness direction.

As illustrated in FIGS. 7(2) and 6, the upper surface side inner layer interlayer circuit 42 of the first circuit 10 is provided so as to pass through the upper surface side beyond a plane circuit 55 of a fourth circuit and the upper surface side inner layer interlayer circuit 42 of the first circuit 10 and the plane circuit 55 of the fourth circuit sandwich the insulating layers 31 and 32 in the plate thickness direction. It should be noted that the plane circuit 55 of the fourth circuit, the first circuit 10, and the second circuit 20 are not interconnected.

In other words, as for the printed circuit board, the insulating layers 31 and 32 are provided between the plane circuit 55 of the fourth circuit and the upper surface side inner layer interlayer circuit 42 of the first circuit 10 in the plate thickness direction of the printed circuit board and the plane circuit 55 of the fourth circuit and the upper surface side inner layer interlayer circuit 42 of the first circuit 10 overlap in the plane direction of the printed circuit board.

In a case where the upper surface side inner layer plane circuit 41 of the first circuit 10 and the upper surface side surface layer circuit 14 of the first circuit 10 are connected with a through hole of straight-line penetration provided in the plate thickness direction as in the related art, the upper surface side inner layer plane circuit 41 of the first circuit 10, the upper surface side surface layer circuit 14 of the first circuit 10, and the plane circuit 55 of the fourth circuit are connected by the through hole and the first circuit 10 and the plane circuit 55 of the fourth circuit become one circuit. As a result, the plane circuit 55 of the fourth circuit cannot be disposed.

On the other hand, according to the embodiment of the invention, the insulating layers 31 and 32 divide the first circuit 10 and the plane circuit 55 of the fourth circuit in the plate thickness direction, and thus the upper surface side inner layer plane circuit 41 of the first circuit 10 and the upper surface side surface layer circuit 14 of the first circuit 10 can be connected by the upper surface side inner layer interlayer circuit 42 of the first circuit 10 and the plane circuit 55 of the fourth circuit can be disposed.

The upper surface side inner layer plane circuit 41 of the first circuit 10 and the upper surface side inner layer interlayer circuit 42 of the first circuit 10 are conductors prepared by plating, and the plating is performed with the upper surface of the upper surface side interlayer circuit 12 of the first circuit 10 and the upper surface of the insulating layer 31 flush with each other. As a result, the contact of the upper surface of the upper surface side interlayer circuit 12 of the first circuit 10 and the upper surface of the insulating layer 31 with the plating solution is satisfactory. As a result, the connection surface is unlikely to peel off due to thermal expansion of the conductor even with the connection surface 53 present. In addition, the plating is performed with the upper surface of the upper surface side inner layer interlayer circuit 42 of the first circuit 10 and the upper surface of the insulating layer 52 flush with each other, and thus the contact of the upper surface of the upper surface side inner layer interlayer circuit 42 of the first circuit 10 and the upper surface of the insulating layer 52 with the plating solution is satisfactory. As a result, the connection surface is unlikely to peel off due to thermal expansion of the conductor even with the connection surface 51 present.

Figure 8:
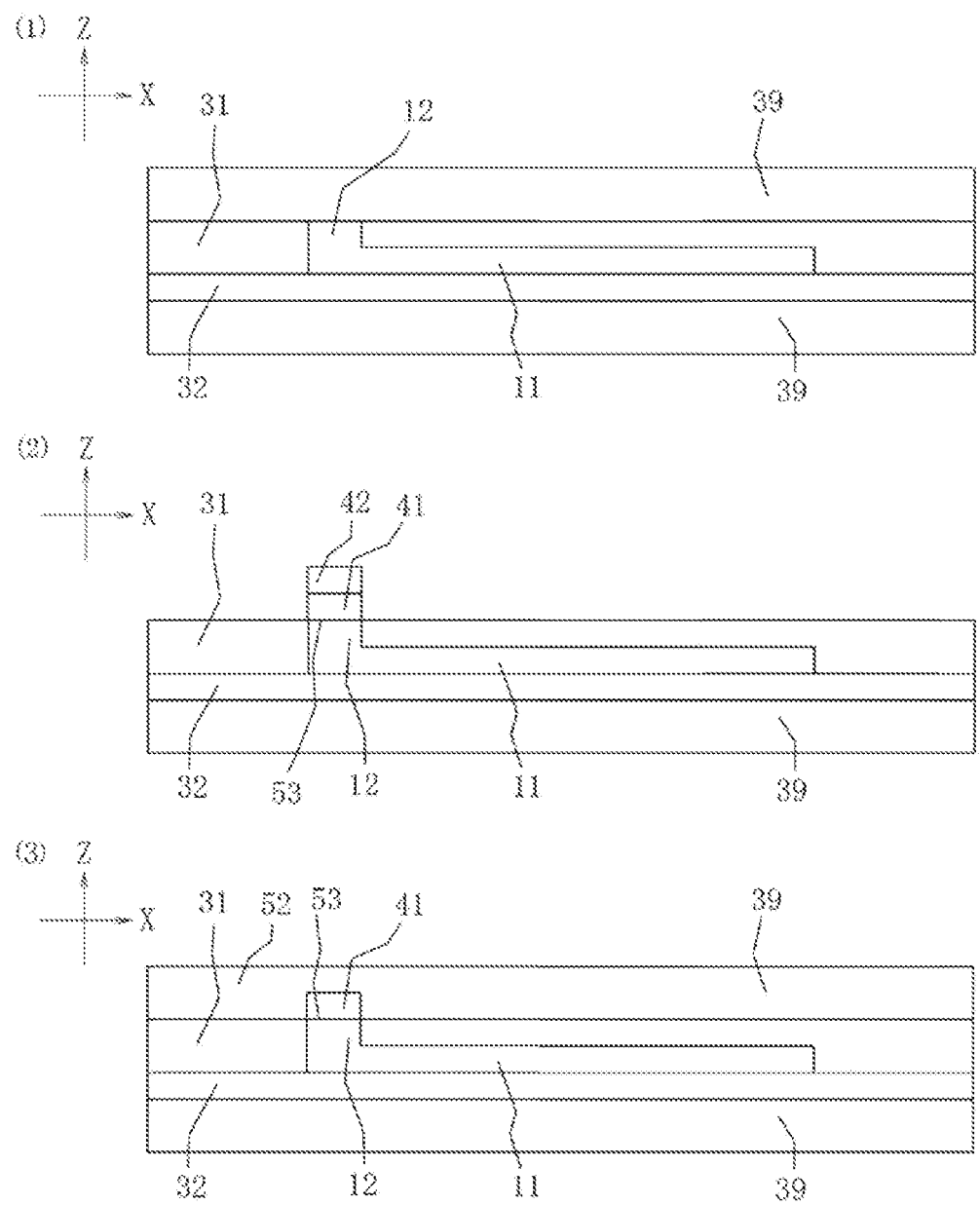
FIG. 8 is a process diagram of a method for manufacturing the printed circuit board according to the third embodiment in the E-E cross-sectional view illustrated in FIG. 6.
Figure 9:
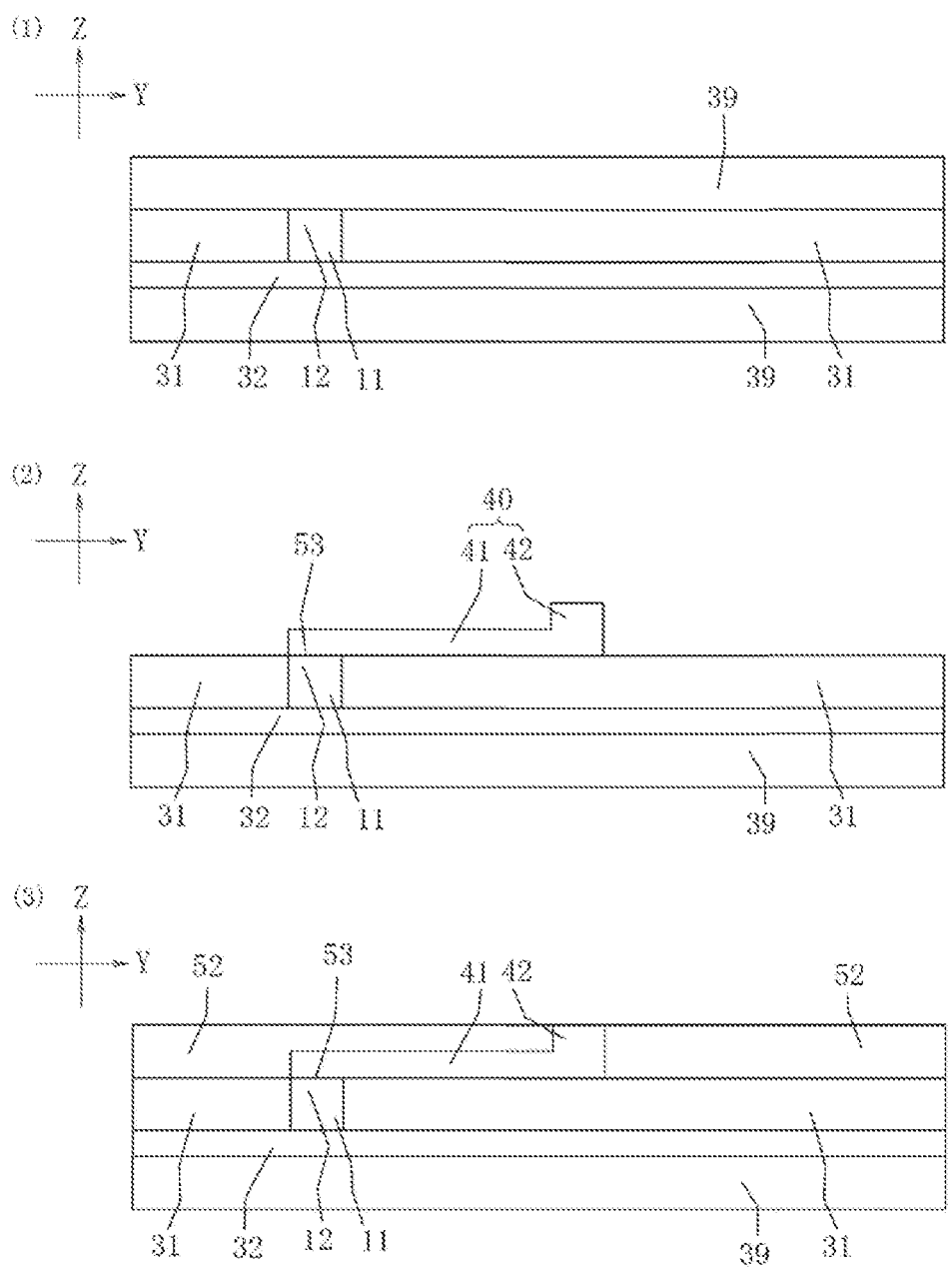
FIG. 9 is a process diagram of the method for manufacturing the printed circuit board according to the third embodiment in the F-F cross-sectional view illustrated in FIG. 6.
Figure 10:
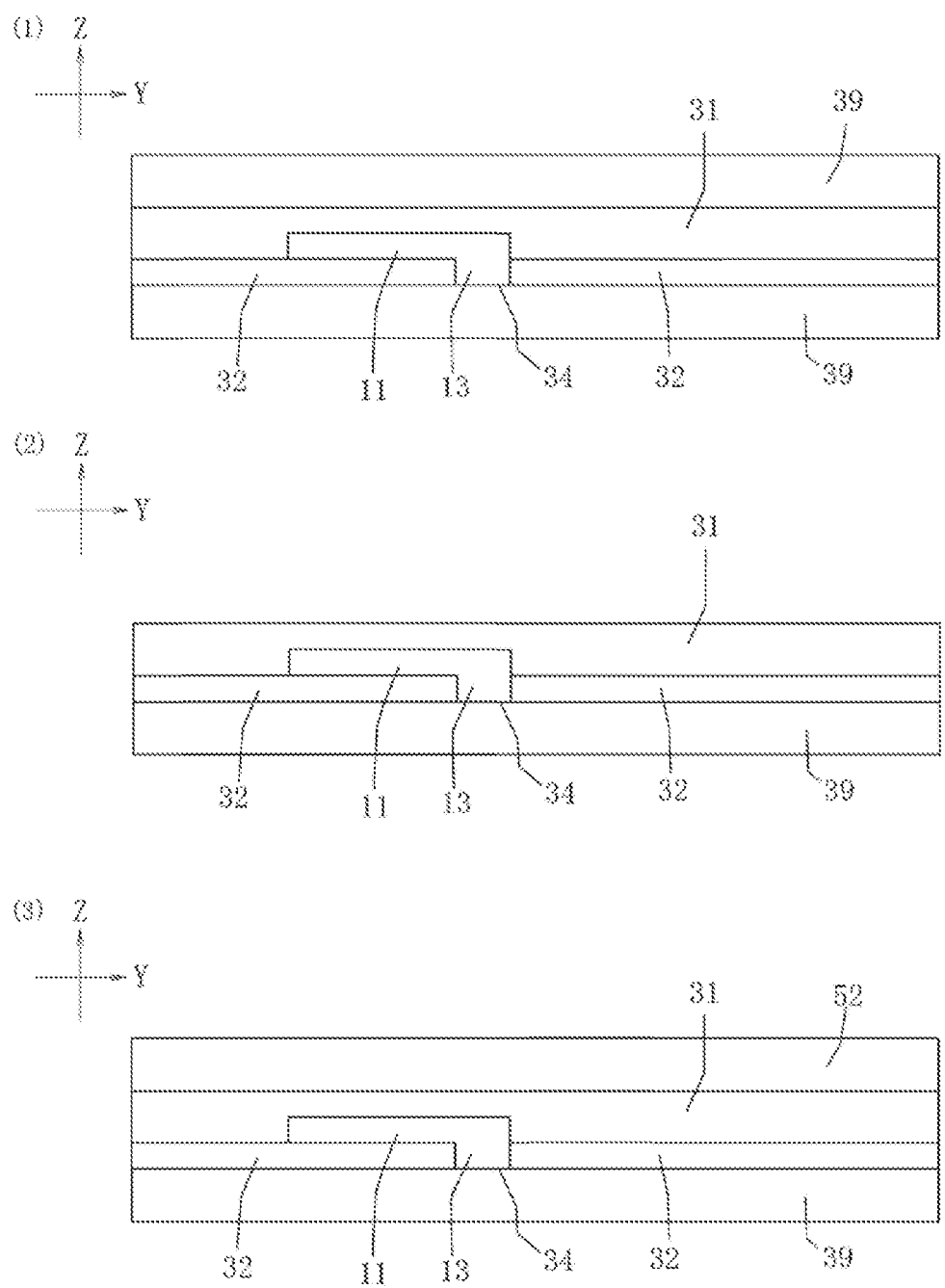
FIG. 10 is a process diagram of the method for manufacturing the printed circuit board according to the third embodiment in the G-G cross-sectional view illustrated in FIG. 6.
Figure 11:
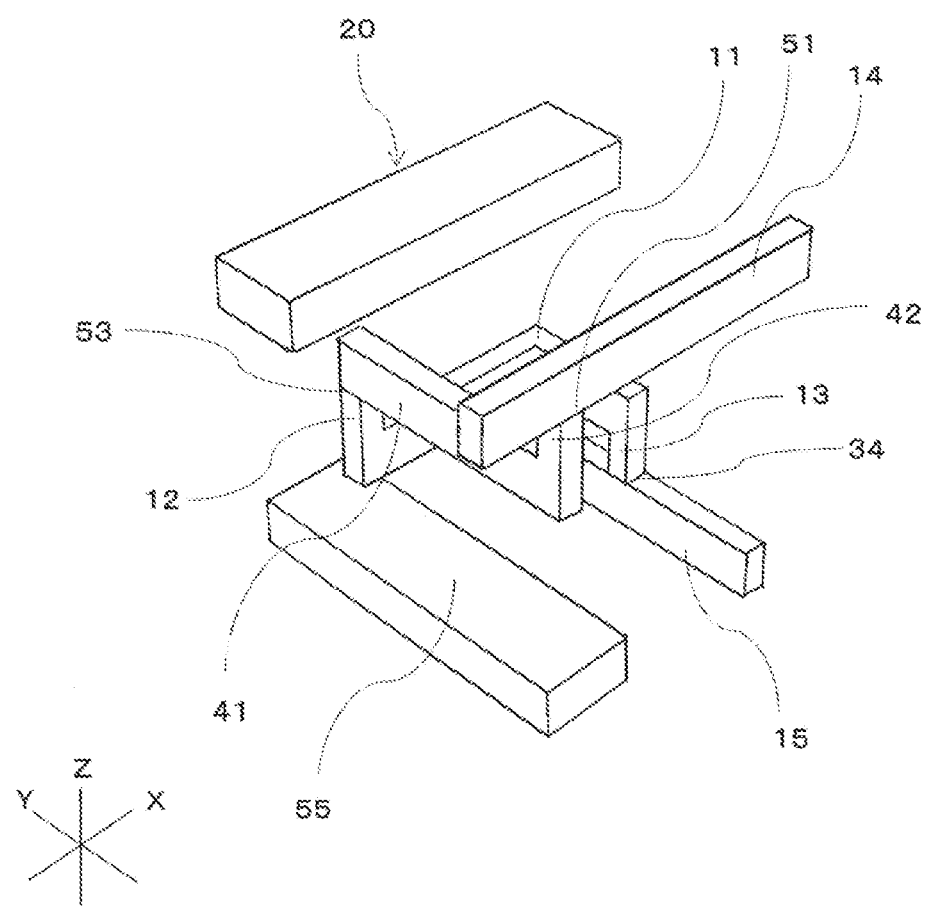
FIG. 11 is a perspective view of a circuit in a state where the insulating layer of the printed circuit board according to the third embodiment is removed.
Figure 12:
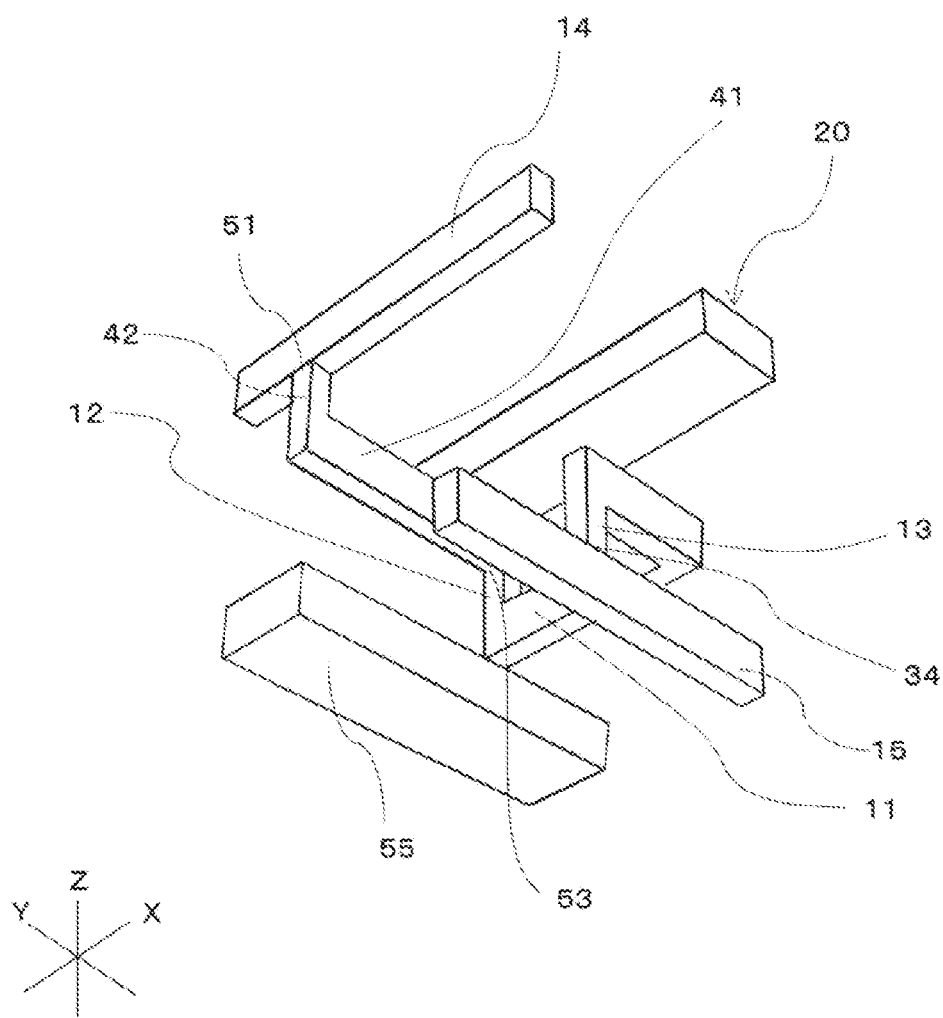
FIG. 12 is a perspective view of the circuit in the state where the insulating layer of the printed circuit board according to the third embodiment is removed.
Figure 13:
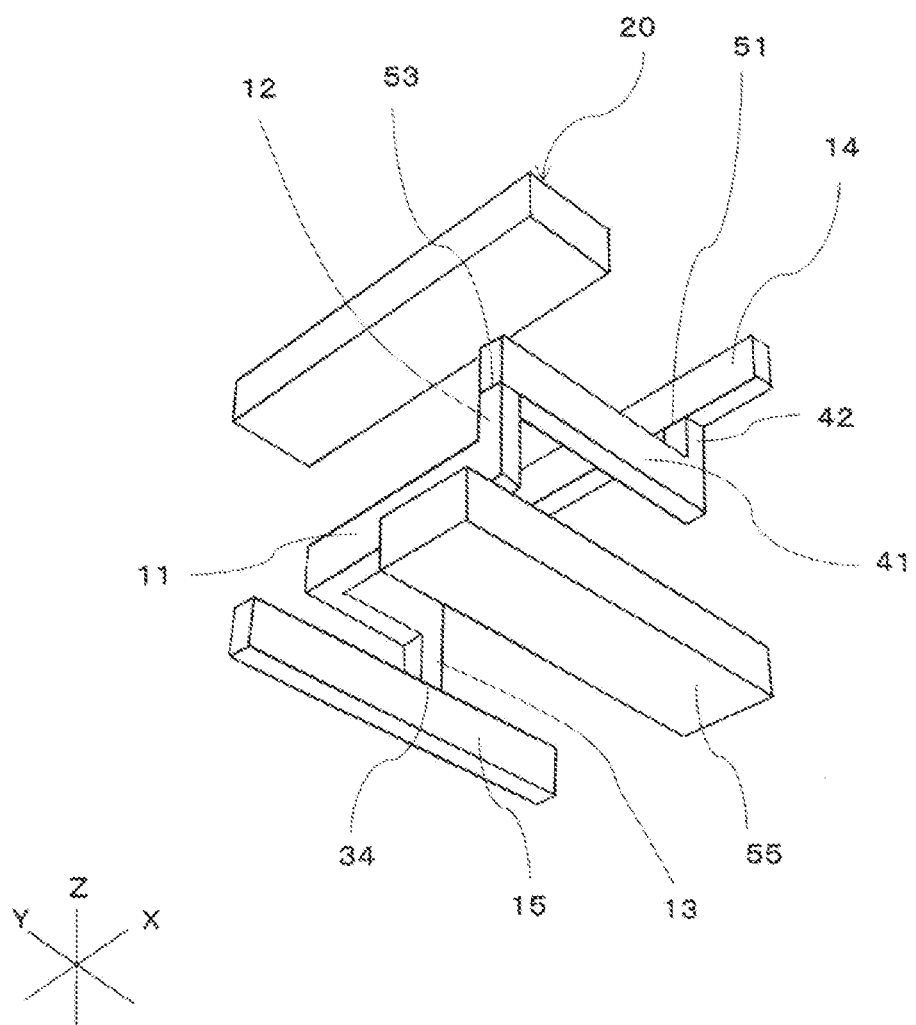
FIG. 13 is a perspective view of the circuit in the state where the insulating layer of the printed circuit board according to the third embodiment is removed.
Figure 14:
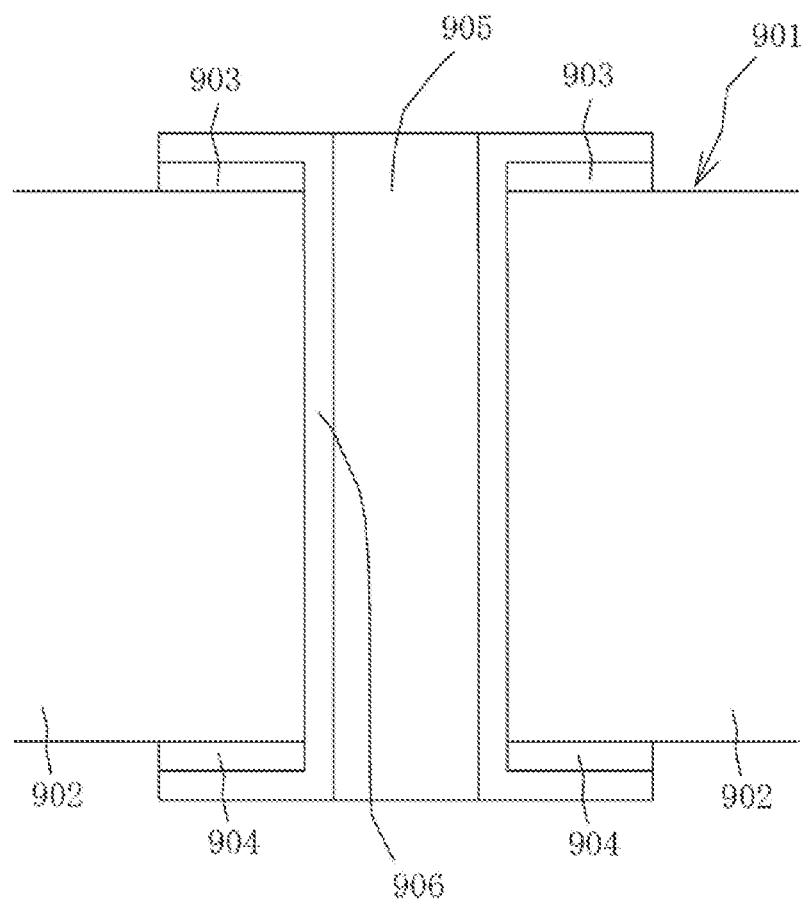
FIG. 14 is a cross-sectional view of the through hole part of the printed circuit board of the related art.

The printed circuit board manufacturing method of the third embodiment will be described with reference to FIGS. 8 to 10. The same steps as in FIGS. 3(1) to 3(5) are performed as described in the manufacturing method of the printed circuit board according to a first embodiment, and a conductor 39 is formed on the entire upper surface side by plating as illustrated in FIGS. 8(1) to 10(1).

Subsequently, the part of the first circuit 10 that becomes the upper surface side inner layer interlayer circuit 42 is protected by a resist and half-etching is performed. The upper surface side inner layer interlayer circuit 42 of the first circuit 10 is prepared as a result. Then, the upper surface side inner layer interlayer circuit 42 of the first circuit 10 and the part of the first circuit 10 that becomes the upper surface side inner layer plane circuit 41 are protected by a resist and etching is performed such that the insulating layer 31 of the lower side layer of the conductor 39 is exposed. As a result, the upper surface side inner layer circuit 40 of the first circuit 10 is prepared as illustrated in FIGS. 8(2), 9(2), and 10(2).

Subsequently, the insulating layer 52 is provided by insulating resin filling. Then, surface polishing and cleaning are performed on the upper surface of the insulating layer 52 and the upper surface of the upper surface side inner layer interlayer circuit 42 of the first circuit 10 and the upper surface of the insulating layer 52 and the upper surface of the upper surface side inner layer interlayer circuit 42 of the first circuit 10 become flush, which results in the state of FIGS. 8(3), 9(3), and 10(3).

Then, plating is performed, a conductor is provided over the upper surface of the insulating layer 52 and the upper surface of the upper surface side inner layer interlayer circuit 42 of the first circuit 10, and the upper surface side surface layer circuit 14 of the first circuit 10, the lower surface side surface layer circuit 15 of the first circuit 10, and the plane circuit 55 of the second circuit 20 are provided . . .

Although the upper surface side inner layer circuit 40 of the first circuit 10 is provided between the upper surface side interlayer circuit 12 and the upper surface side surface layer circuit 14 of the first circuit 10 of the second embodiment in the structure of the third embodiment, a lower surface side inner layer circuit of the first circuit 10 including a lower surface side inner layer interlayer circuit of the first circuit 10 and a lower surface side inner layer plane circuit of the first circuit 10 may be provided between the lower surface side interlayer circuit 13 of the first circuit 10 and the lower surface side surface layer circuit 15 of the first circuit 10. The lower surface side inner layer circuit of the first circuit 10 is the same as the upper surface side inner layer circuit 40 of the first circuit 10 in a state where the printed circuit board of the third embodiment is reversed, and the lower surface side inner layer interlayer circuit of the first circuit 10 and the lower surface side inner layer plane circuit of the first circuit 10 are connection surface-less circuits.

In addition, it is also possible to stack a plurality of the upper surface side inner layer circuits 40 of the first circuit 10 between the upper surface side interlayer circuit 12 of the first circuit 10 and the upper surface side surface layer circuit 14 of the first circuit 10 and it is also possible to stack a plurality of the lower surface side inner layer circuits of the first circuit 10 between the lower surface side interlayer circuit 13 of the first circuit 10 and the lower surface side surface layer circuit 15 of the first circuit 10.

It is also possible to apply the upper surface side inner layer circuit 40 and the lower surface side inner layer circuit of the first circuit 10 of the third embodiment to the first and second embodiments.

In addition, an upper surface side inner layer circuit of the second circuit 20 may be provided similarly to the upper surface side inner layer circuit 40 of the first circuit 10 between the upper surface side interlayer circuit 22 and the upper surface side surface layer circuit 24 of the second circuit 20 of the first embodiment.

Further, a lower surface side inner layer circuit of the second circuit 20 similar to the lower surface side inner layer interlayer circuit of the first circuit 10 may be provided between the lower surface side interlayer circuit 23 of the second circuit 20 and the lower surface side surface layer circuit 25 of the second circuit 20.

The plane circuit 55 of the fourth circuit may have a middle interlayer circuit of the fourth circuit, an upper surface side interlayer circuit of the fourth circuit, and a lower surface side interlayer circuit of the fourth circuit similarly to the second circuit 20 of the first embodiment. It should be noted that the middle interlayer circuit of the fourth circuit, the upper surface side interlayer circuit of the fourth circuit, and the lower surface side interlayer circuit of the fourth circuit are circuits provided from an integral conductor without a connection surface provided from a plate-shaped conductor. Further, the plane circuit 55 of the fourth circuit may have an upper surface side inner layer circuit of the fourth circuit similar to the upper surface side inner layer circuit 40 of the first circuit 10 and may have a lower surface side inner layer circuit of the fourth circuit similar to the lower surface side inner layer circuit of the first circuit 10.

In the invention described herein, the interlayer circuit of one circuit and the other circuit not connected to one circuit are disposed so as to overlap in a plan view. The plane circuits of the respective layers of one circuit can be interconnected without providing a through hole in the plate thickness direction, and thus the other circuit can be disposed with an insulating layer sandwiched on the upper surface side or the lower surface side beyond the interlayer circuit of one circuit. As a result, the degree of freedom in circuit design is improved.

In addition, connection is performed in a state where the connection part between the interlayer circuit extending in the plate thickness direction and the plane circuit extending in the plane direction lacks a connection surface or a state where the connection part between the . . . interlayer circuit extending in the plate thickness direction and the plane circuit extending in the plane direction is flush with the insulating layer and the connection is performed without a connection surface in the plate thickness direction. As a result, the printed circuit board is unlikely to cause a connection failure.

The interlayer circuit of one circuit in a circuit in which an interlayer circuit of one circuit and a . . . circuit that is not connected to the other circuit are arranged so as to overlap in a plan view includes the upper surface side interlayer circuit 12 of the first circuit 10, the lower surface side interlayer circuit 13 of the first circuit 10, the upper surface side inner layer interlayer circuit 42 of the upper surface side inner layer circuit 40 prepared from a conductor prepared by plating, and the inner layer interlayer circuit of the lower surface side inner layer circuit prepared from a conductor prepared by plating.

In addition, the plane circuit of one circuit in the plane circuits of the respective layers of one circuit connected by the interlayer circuit of one circuit includes the middle interlayer circuit 11 of the first circuit 10, the upper surface side interlayer circuit 12 of the first circuit 10, the lower surface side interlayer circuit 13 of the first circuit 10, the upper surface side inner layer plane circuit 41 of the first circuit 10, and the inner layer plane circuit of the first circuit 10 prepared from a conductor prepared by plating in the first circuit 10.

In addition, the other circuit not connected to one circuit in a circuit in which an interlayer circuit of one circuit and a circuit that is not connected to the other circuit are arranged so as to overlap in a plan view includes the second circuit 20, the upper surface side inner layer circuit 40 of the second circuit 20 prepared from a conductor prepared by plating in the second circuit 20, the lower surface side inner layer circuit of the second circuit 20 prepared from a conductor prepared by plating in the second circuit 20, the lower surface side surface layer circuit 16 of the third circuit, and the plane circuit 55 of the fourth circuit (including a case where the plane circuit 55 of the fourth circuit has the middle interlayer circuit of the fourth circuit, the upper surface side interlayer circuit of the fourth circuit, the lower surface side interlayer circuit of the fourth circuit, the upper surface side inner layer circuit of the fourth circuit, and the lower surface side inner layer circuit of the fourth circuit).

It should be noted that the sum of the thicknesses (heights) of the middle interlayer circuit 11 of the first circuit 10 of the substrate intermediate body 60, the upper surface side interlayer circuit 12 of the first circuit 10, and the lower surface side interlayer circuit 13 of the first circuit 10 in the plate thickness direction decreases as a result of surface polishing and cleaning. In addition, the sum of the thicknesses (heights) of the middle interlayer circuit 21 of the second circuit 20 of the substrate intermediate body 60, the upper surface side interlayer circuit 22 of the second circuit 20, and the lower surface side interlayer circuit 23 of the second circuit 20 in the plate thickness direction decreases as a result of surface polishing and cleaning. In other words, the thickness of the conductor 38 decreases during the manufacturing of the printed circuit board.

In a case where a rolled copper plate or rolled aluminum is used as the conductor 38, the lower limit value of the thickness of the substrate intermediate body 60 is preferably 0.25 mm or more and more preferably 0.55 mm or more. In addition, in a case where a rolled copper plate or rolled aluminum is used, the thickness of the substrate intermediate body 60 is preferably less than 2.0 mm and more preferably less than 1.0 mm. Within this range, the substrate intermediate body 60 can be easily handled in the manufacturing process.

In addition, in a case where the thickness of the substrate intermediate body 60 is 0.55 mm or more, the risk of warpage of the substrate intermediate body 60 is reduced. Accordingly, the risk of substrate warpage can be reduced even in the case of a printed circuit board including the substrate intermediate body 60 that has an upper surface side inner layer circuit, an upper surface side surface layer circuit, a lower surface side surface layer circuit, and the like.

Further, depth on the occasion of etching is ensured and the insulating layer 31 and the insulating layer 32 can be sufficiently filled. As a result, the risk of cracking. of the insulating layer 31 or the insulating layer 32 is reduced.

The middle interlayer circuit 11 of the first circuit 10, the upper surface side interlayer circuit 12 of the first circuit 10, the lower surface side interlayer circuit 13 of the first circuit 10, the middle interlayer circuit 21 of the second circuit 20, the upper surface side interlayer circuit 22 of the second circuit 20, and the lower surface side interlayer circuit 23 of the second circuit 20 formed using a rolled copper plate or rolled aluminum plate are layered metal structures extending in the rolling direction (plane direction (XY-axis direction) of the printed circuit board). In addition, heat treatment in the printed circuit board preparation process results in almost equiaxed crystal grains.

The circuit of the conductor (copper) formed by plating is a metal structure that is columnar in the thickness direction (Z-axis direction).

The electronic device of the invention is provided with the printed circuit board of the invention, its use is not particularly limited, and examples thereof include automobiles, aircraft, unmanned aerial vehicles, mobile phones, smartphones, personal computers, LED modules, and power semiconductor modules. With this electronic device, the number of connection surfaces between conductors as printed circuit board circuits can be reduced and the connection surfaces are satisfactorily connected in the printed circuit board. As a result, an inter-conductor connection failure can be suppressed. In addition, the resistance value at the part of inter-conductor connection can be reduced and the power loss at the part of inter-conductor connection (power consumption of the electronic device) can be reduced.

EXPLANATIONS OF LETTERS OR NUMERALS

10 FIRST CIRCUIT
11 MIDDLE INTERLAYER CIRCUIT
12 UPPER SURFACE SIDE INTERLAYER CIRCUIT
13 LOWER SURFACE SIDE INTERLAYER CIRCUIT
14 UPPER SURFACE SIDE SURFACE LAYER CIRCUIT
15 LOWER SURFACE SIDE SURFACE LAYER CIRCUIT
16 LOWER SURFACE SIDE SURFACE LAYER CIRCUIT OF THIRD CIRCUIT
20 SECOND CIRCUIT
21 MIDDLE INTERLAYER CIRCUIT
22 UPPER SURFACE SIDE INTERLAYER CIRCUIT
23 LOWER SURFACE SIDE INTERLAYER CIRCUIT
24 UPPER SURFACE SIDE SURFACE LAYER CIRCUIT
25 LOWER SURFACE SIDE SURFACE LAYER CIRCUIT
30 PRINTED CIRCUIT BOARD
31 INSULATING LAYER
32 INSULATING LAYER
33 CONNECTION SURFACE
34 CONNECTION SURFACE
35 CONNECTION SURFACE
36 CONNECTION SURFACE
38 CONDUCTOR
39 CONDUCTOR
40 UPPER SURFACE SIDE INNER LAYER CIRCUIT
41 UPPER SURFACE SIDE INNER LAYER PLANE CIRCUIT
42 UPPER SURFACE SIDE INNER LAYER INTERLAYER CIRCUIT
51 CONNECTION SURFACE
52 INSULATING LAYER
53 CONNECTION SURFACE
54 CONNECTION SURFACE
55 PLANE CIRCUIT OF FOURTH CIRCUIT
60 SUBSTRATE INTERMEDIATE BODY

The invention claimed is:

1. A printed circuit board comprising:
a middle interlayer circuit extending in a plane direction of the printed circuit board;
an upper surface side interlayer circuit provided on one end side of the middle interlayer circuit and extending in a plate thickness direction;
a lower surface side interlayer circuit provided on the other end side of the middle interlayer circuit and extending in the plate thickness direction;
an insulating layer;
an upper surface side inner layer plane circuit; and
an upper surface side inner layer interlayer circuit, wherein
the middle interlayer circuit, the upper surface side interlayer circuit, and the lower surface side interlayer circuit are provided from a connection surface-less integral conductor,
the upper surface side inner layer plane circuit and the upper surface side inner layer interlayer circuit are configured from an integral conductor having no connection surface in the plate thickness direction and the plane direction at a connection part between the upper surface side inner layer plane circuit and the upper surface side inner layer interlayer circuit,
the middle interlayer circuit, the upper surface side interlayer circuit, and the lower surface side interlayer circuit are formed by etching from a plate-shaped conductor,
the upper surface side inner layer plane circuit and the upper surface side inner layer interlayer circuit are provided by a conductor provided by plating,
the upper surface side inner layer plane circuit is provided over an upper surface of the insulating layer and an upper surface of the upper surface side interlayer circuit in a state where the upper surface of the insulating layer and the upper surface of the upper surface side interlayer circuit are flush with each other and the upper surface side inner layer plane circuit and the upper surface side interlayer circuit have a connection surface in the plane direction having no connection surface in the plate thickness direction,
the upper surface side interlayer circuit is connected to the other end side of the upper surface side inner layer plane circuit and the upper surface side inner layer interlayer circuit is provided on one end side of the upper surface side inner layer plane circuit,
an interlayer circuit of one circuit and another circuit not connected to the one circuit are disposed so as to overlap in a plan view and the another circuit is disposed with an insulating layer sandwiched on an upper surface side or a lower surface side beyond the interlayer circuit of the one circuit,
the interlayer circuit of the one circuit is the upper surface side interlayer circuit, the lower surface side interlayer circuit, or the upper surface side inner layer interlayer circuit, the another circuit has an upper surface side interlayer circuit extending in the plate thickness direction, a middle interlayer circuit extending in the plane direction, and a lower surface side interlayer circuit extending in the plate thickness direction,
the upper surface side interlayer circuit, the middle interlayer circuit, and the lower surface side interlayer circuit are provided from a connection surface-less integral conductor, and
the middle interlayer circuit, the upper surface side interlayer circuit, and the lower surface side interlayer circuit are provided by etching from a plate-shaped conductor.

* * * * *